United States Patent
Yazaki et al.

(10) Patent No.: US 10,645,798 B2
(45) Date of Patent: May 5, 2020

(54) COMPOSITE COMPONENT-EMBEDDED CIRCUIT BOARD AND COMPOSITE COMPONENT

(71) Applicant: Murata Manufacturing Co., Ltd., Nagaokakyo-shi, Kyoto-fu (JP)

(72) Inventors: Hirokazu Yazaki, Nagaokakyo (JP); Keito Yonemori, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/128,571

(22) Filed: Sep. 12, 2018

(65) Prior Publication Data
US 2019/0014655 A1  Jan. 10, 2019

Related U.S. Application Data

(63) Continuation of application No. PCT/JP2017/014851, filed on Apr. 11, 2017.

(30) Foreign Application Priority Data

Apr. 14, 2016  (JP) ................................ 2016-081471

(51) Int. Cl.
*H05K 1/02* (2006.01)
*H05K 1/18* (2006.01)
(Continued)

(52) U.S. Cl.
CPC ....... *H05K 1/0216* (2013.01); *H01F 17/0013* (2013.01); *H01F 17/04* (2013.01);
(Continued)

(58) Field of Classification Search
CPC ...... H05K 1/0216; H05K 1/116; H05K 1/181; H05K 3/46; H05K 2201/09827;
(Continued)

(56) References Cited

U.S. PATENT DOCUMENTS 6,346,865 B1 * 2/2002 Callewaert .......... H03H 1/0007
333/184
2003/0034796 A1   2/2003 Tsujiguchi
(Continued)

FOREIGN PATENT DOCUMENTS

JP      2000-151324 A    5/2000
JP      2000-151327 A    5/2000
(Continued)

OTHER PUBLICATIONS

Machine translation of Kitajima Japanese Patent Document JP 2010-141128 A Jun. 24, 2010 (Year: 2010).*

(Continued)

*Primary Examiner* — Kevin J Comber
(74) *Attorney, Agent, or Firm* — Keating & Bennett, LLP

(57) ABSTRACT

A composite component-embedded circuit board includes a circuit board including a first functional block disposed closer to an upper surface of the circuit board, and a second functional block different from the first functional block and disposed closer to a lower surface of the circuit board, and a composite chip circuit embedded in the circuit board and including first and second circuit elements. The composite component further includes first and second terminal electrodes. The first terminal electrode is disposed on an upper surface of the composite component. The first terminal electrode is connected to the composite circuit and to the first functional block. The second terminal electrode is disposed on a lower surface of the composite component. The second terminal electrode is connected to the composite circuit and to the second functional block.

19 Claims, 16 Drawing Sheets

(51) Int. Cl.

| | | |
|---|---|---|
| | *H01L 23/498* | (2006.01) |
| | *H01F 17/00* | (2006.01) |
| | *H01F 17/04* | (2006.01) |
| | *H01F 27/40* | (2006.01) |
| | *H01G 4/30* | (2006.01) |
| | *H01G 4/40* | (2006.01) |
| | *H05K 1/11* | (2006.01) |
| | *H05K 3/46* | (2006.01) |
| | *H03H 1/00* | (2006.01) |
| | *H03H 7/01* | (2006.01) |

(52) U.S. Cl.
CPC .............. *H01F 27/40* (2013.01); *H01G 4/30* (2013.01); *H01G 4/40* (2013.01); *H01L 23/49822* (2013.01); *H05K 1/0233* (2013.01); *H05K 1/116* (2013.01); *H05K 1/181* (2013.01); *H05K 1/186* (2013.01); *H01F 2017/0026* (2013.01); *H01F 2017/0066* (2013.01); *H01L 2224/16225* (2013.01); *H01L 2924/19105* (2013.01); *H03H 7/0115* (2013.01); *H03H 2001/0085* (2013.01); *H05K 3/4632* (2013.01); *H05K 2201/09827* (2013.01); *H05K 2201/1003* (2013.01); *H05K 2201/1006* (2013.01); *H05K 2201/10015* (2013.01)

(58) Field of Classification Search
CPC . H05K 2201/10015; H05K 2201/1003; H05K 2201/1006; H01F 17/0013; H01F 17/04; H01F 27/40; H01F 2017/0026; H01F 2017/0066; H01G 4/30; H01G 4/40; H01L 23/49822; H01L 2224/16225; H01L 2924/19105; H03H 7/0115; H03H 7/075

USPC ......................................................... 361/270
See application file for complete search history.

(56) References Cited

U.S. PATENT DOCUMENTS

| | | | |
|---|---|---|---|
| 2003/0076199 A1 | 4/2003 | Yamaguchi | |
| 2007/0076392 A1* | 4/2007 | Urashima | H01G 2/06 361/763 |
| 2009/0195334 A1* | 8/2009 | Goi | H04B 1/03 333/203 |
| 2015/0282328 A1 | 10/2015 | Hamada et al. | |
| 2015/0351243 A1 | 12/2015 | Toda et al. | |

FOREIGN PATENT DOCUMENTS

| | | |
|---|---|---|
| JP | 2001-332862 A | 11/2001 |
| JP | 2003-100524 A | 4/2003 |
| JP | 2003-133881 A | 5/2003 |
| JP | 2003-198307 A | 7/2003 |
| JP | 2005-086676 A | 3/2005 |
| JP | 2010-141128 A | 6/2010 |
| JP | 2011-023381 A | 2/2011 |
| JP | 2014-011284 A | 1/2014 |
| JP | 2014-138069 A | 7/2014 |
| JP | 2015-185812 A | 10/2015 |
| JP | 2016-006847 A | 1/2016 |

OTHER PUBLICATIONS

Official Communication issued in International Patent Application No. PCT/JP2017/014851, dated Jun. 27, 2017.

\* cited by examiner

COMPOSITE COMPONENT-EMBEDDED CIRCUIT BOARD AND COMPOSITE COMPONENT

CROSS REFERENCE TO RELATED APPLICATIONS

This application claims the benefit of priority to Japanese Patent Application No. 2016-081471 filed on Apr. 14, 2016 and is a Continuation Application of PCT Application No. PCT/JP2017/014851 filed on Apr. 11, 2017. The entire contents of each application are hereby incorporated herein by reference.

BACKGROUND OF THE INVENTION

1. Field of the Invention

The present invention relates to a composite component-embedded circuit board and a composite component, and particularly, to a technology to achieve intended circuit characteristics.

2. Description of the Related Art

Examples of known surface mount devices include devices defining an LC circuit, such as a high-pass filter and a low-pass filter (see, for example, Japanese Unexamined Patent Application Publication No. 2003-198307 and Japanese Unexamined Patent Application Publication No. 2003-100524). These surface mount devices include an LC circuit embedded in a ceramic element, and include an input/output terminal and a ground terminal on a side surface of the ceramic element. The LC circuit includes a pattern conductor (coil conductor) defining an inductor and a pattern conductor (capacitor conductor) defining a capacitor.

In recent years, size or thickness reduction of portable terminal devices, such as cellular phone handsets, and an increase of the number of devices for multifunction purposes require size reduction and high-density packaging of devices. A component-embedded circuit board including a surface mount device embedded in a substrate, such as a printed circuit board, has been disclosed to address this requirement.

A circuit board including a surface mount device embedded in the substrate, however, may fail to acquire intended circuit characteristics due to a parasitic inductance component generated between a circuit in the device and a circuit installed on the substrate. Particularly when a substrate including a surface mount device embedded therein is used as a high-frequency circuit device, such a parasitic inductance component may be a main cause of inhibiting the device from acquiring intended high-frequency characteristics.

A typical substrate is likely to have unstable connection between the pattern conductor disposed over the main surface of the substrate and a via conductor (interlayer connection conductor) disposed perpendicularly to the main surface. Thus, a board including a device embedded in the substrate may fail to acquire intended circuit characteristics due to a reduction of connection reliability due to an increase of the stress exerted at a connection portion between the pattern conductor and the via conductor.

SUMMARY OF THE INVENTION

Preferred embodiments of the present invention provide composite component-embedded circuit boards and composite components that are able to achieve intended circuit characteristics.

A composite component-embedded circuit board according to a preferred embodiment of the present invention includes a circuit board including a first functional block disposed closer to an upper surface of the circuit board, and a second functional block different from the first functional block and disposed closer to a lower surface of the circuit board; and a composite component embedded in the circuit board, the composite component being a chip composite circuit including a first circuit element and a second circuit element. The composite component further includes a first terminal electrode disposed on an upper surface of the composite component, the first terminal electrode being connected to the composite circuit and to the first functional block, and a second terminal electrode disposed on a lower surface of the composite component, the second terminal electrode being connected to the composite circuit and to the second functional block.

As described above, the first terminal electrode on the upper surface of the composite component is connected to the first functional block disposed closer to the upper surface of the circuit board, and the second terminal electrode on the lower surface of the composite component is connected to the second functional block disposed closer to the lower surface of the circuit board. This structure reduces the wiring length of the wiring required inside the circuit board. Specifically, the circuit structure required for a circuit board can be achieved with a reduced wiring length. This structure thus eliminates extra wire routing in the circuit board and reduces the parasitic inductance component of the wiring in the circuit board so as to achieve intended circuit characteristics.

The first terminal electrode and the second terminal electrode are separately disposed on the upper and lower surfaces. The sizes of these electrodes are thus able to be increased. This structure prevents degradation of electrical connection of the first terminal electrode and the second terminal electrode to the circuit board, and reduces the parasitic inductance component.

The first circuit element and the second circuit element may be passive elements, and the composite component may include a multilayer element including a plurality of first base layers that are vertically laminated, and pattern conductors embedded in the multilayer element, the pattern conductors defining the first circuit element and the second circuit element.

This structure enables size reduction of the composite component, and thus, the embedded composite component enables reduction of stress exerted on the circuit board. This structure thus achieves intended circuit characteristics while preventing the circuit board from being cracked or having other defects.

The first circuit element and the second circuit element may be serially connected in this order between the first terminal electrode and the second terminal electrode, the pattern conductor defining the first circuit element may be one-sidedly located closer to the upper surface of the composite component, and the pattern conductor defining the second circuit element may be one-sidedly located closer to the lower surface of the composite component.

This structure eliminates extra wire routing in the composite component, and reduces the parasitic inductance component of the wiring in the composite component to achieve intended circuit characteristics.

The first terminal electrode and the second terminal electrode may be positioned to at least partially overlap each other when the circuit board is viewed in a plan view.

This structure prevents the composite component from being warped. Warpage of devices embedded in the circuit board generally causes an increase of the stress exerted on the circuit board. This structure that prevents the composite component from being warped to reduce stress exerted on the circuit board thus achieves intended circuit characteristics while preventing the circuit board from being cracked or having other defects.

The composite component may include a plurality of the first terminal electrodes.

Thus, the composite circuit including the composite component and the first functional block is able to be connected together with multiple wiring routes in the circuit board. This structure improves flexible arrangement of components, such as wiring and circuit elements, defining the first functional block in the composite component-embedded circuit board.

The first functional block may include a signal processing circuit. The first terminal electrode may define and function as an input terminal that receives signals from the signal processing circuit, or an output terminal that outputs signals to the signal processing circuit. The second functional block may include a ground. The second terminal electrode may define and function as a ground terminal connected to the ground.

This structure allows a positive element such as the first functional block including a signal processing circuit to be disposed only on the side of the circuit board closer to the upper surface. This structure prevents the number of processes for manufacturing the composite component-embedded circuit board from increasing.

The second terminal electrode may be disposed substantially throughout the lower surface of the composite component.

This structure enables secure electric connection between the second terminal electrode and the circuit board. Specifically, grounding of the second terminal electrode is improved (stabled) to achieve intended circuit characteristics.

The circuit board may be a multilayer substrate including a plurality of second base layers vertically laminated together. The second functional block may be a ground pattern conductor disposed in layers of the circuit board.

This structure reduces wire routing between the second terminal electrode and the ground pattern conductor and reduces the parasitic inductance component of the wiring to achieve intended circuit characteristics.

The signal processing circuit may include an electrical component mounted on the upper surface of the circuit board.

This structure enables space saving of the composite component-embedded circuit board including the electrical component.

The composite circuit may be an LC composite circuit in which either the first circuit element or the second circuit element is a capacitor and the other is an inductor.

This structure achieves the composite component-embedded circuit board in which a composite component defining, for example, an LC filter such as a low-pass filter, a bandpass filter, or a high-pass filter, or a diplexer that is a combination of these filters is embedded.

One opposing electrode of a pair of opposing electrodes defining the capacitor may include the first terminal electrode or the second terminal electrode.

This structure enables a reduction in thickness (or reduction in height) of the composite component, and also a reduction in thickness of the composite component-embedded circuit board.

The composite component may include ceramics as a main base material.

Thus, the composite component is a sintered body obtained through sintering.

The circuit board may include a resin as a main base material.

When, for example, the resin is a thermoplastic resin, a circuit board including an embedded composite component (that is, composite component-embedded circuit board) is able to be manufactured by placing the composite component in the resin material before thermosetting, and subjecting the resultant material to heat treatment.

The first functional block may be disposed closer to the upper surface than is the composite component, and the second functional block may be disposed closer to the lower surface than is the composite component.

This structure eliminates extra wire routing of the wiring in the circuit board and reduces the parasitic inductance component of the wiring in the circuit board to achieve intended circuit characteristics.

Preferred embodiments of the present invention may be composite components. Specifically, a composite component according to a preferred embodiment of the present invention includes a multilayer element including a plurality of first base layers that are vertically laminated; a composite circuit that is defined by a chip circuit provided on the multilayer element, the composite circuit including a first circuit element and a second circuit element that are passive elements including pattern conductors embedded in the multilayer element; a first terminal electrode disposed on an upper surface of the multilayer element, the first terminal electrode being connected to a portion of the composite circuit; and a second terminal electrode disposed on a lower surface of the multilayer element, the second terminal electrode being connected to another portion of the composite circuit.

Composite component-embedded circuit boards and composite components according to preferred embodiments of the present invention are able to achieve intended circuit characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
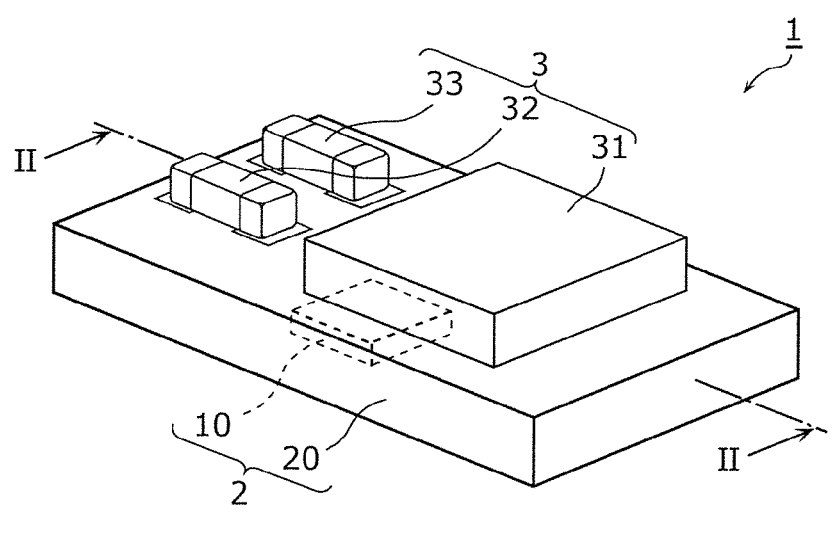
FIG. 1 is a perspective view of a module component including a composite component-embedded circuit board according to a preferred embodiment of the present invention.
Figure 1:
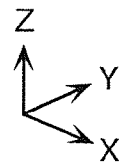

Composite component-embedded circuit boards according to preferred embodiments of the present invention are described below with reference to the drawings. Preferred embodiments described below are preferred examples of the present invention. The numerical values, shapes, materials, components, positions of the components, connection structures of the components, manufacturing processes, the order of the manufacturing processes, and other specific details described in the description below are mere examples and not intended to limit the present invention. Of components according to preferred embodiments described below, components not described in independent claims, representing subordinate concepts, are described as optional components. The size or dimensional ratio of components illustrated in the drawings is not necessarily precise.

FIG. 1 is a perspective view of a module component 1 including a composite component-embedded circuit board 2 according to a preferred embodiment of the present invention.

In FIG. 1, the thickness direction of the composite component-embedded circuit board 2 refers to a Z-axis direction, and the directions perpendicular or substantially perpendicular to the Z-axis direction and orthogonal or substantially orthogonal to each other refer to an X-axis direction and a Y-axis direction. A positive Z-axis direction is directed to a top surface (upper surface) of the composite component-embedded circuit board 2. In actual use, however, the thickness direction of the composite component-embedded circuit board 2 may differ from the vertical direction. Thus, the top surface of the composite component-embedded circuit board 2 is not limited to the upper surface in actual use.

The module component 1 defines a predetermined circuit, such as a receiving circuit of a portable terminal device, for example. As illustrated in FIG. 1, the module component 1 includes a composite component-embedded circuit board 2, including a composite component 10 and a circuit board 20 in which the composite component 10 is embedded, and electrical components 3 of various types, mounted on the composite component-embedded circuit board 2.

In the present preferred embodiment, the electrical components 3 preferably include a radio frequency integrated circuit (RFIC) 31, which is a semiconductor integrated circuit element including a signal processing circuit, and chip components 32 and 33 defining, for example, a matching circuit. In the present preferred embodiment, these electrical components 3 are disposed on the upper surface of the composite component-embedded circuit board 2. The surface on which the electrical components 3 are mounted is not limited to this, and may be, for example, a lower surface of the circuit board 20.

The detailed structure of the composite component-embedded circuit board 2 is further described below with reference to FIG. 2.

Figure 2:
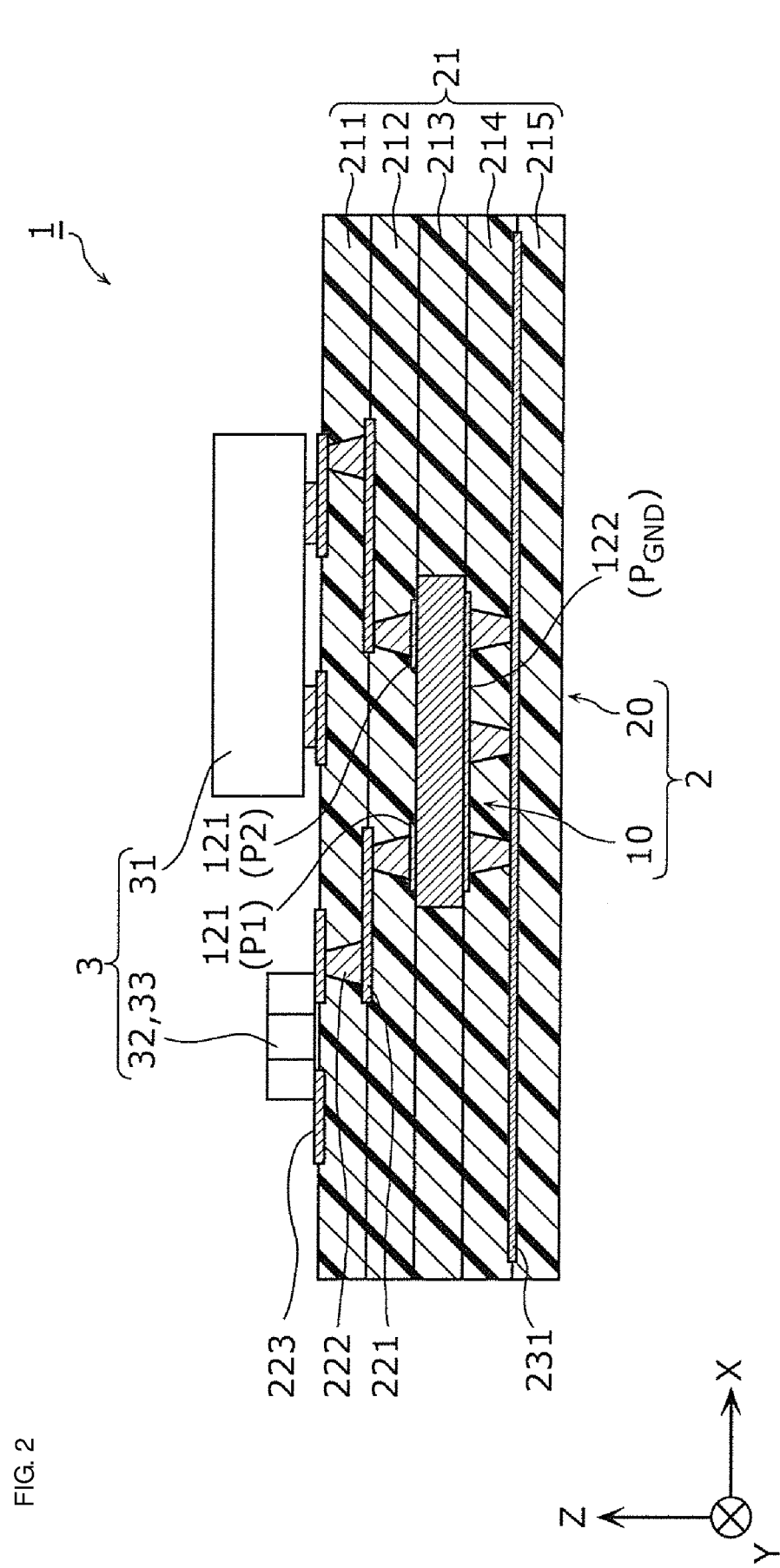
FIG. 2 is a schematic diagram of the sectional structure of a composite component-embedded circuit board according to a preferred embodiment of the present invention.

FIG. 2 is a schematic diagram of the sectional structure of the composite component-embedded circuit board 2 according to a preferred embodiment. Specifically, FIG. 2 is a sectional view of the composite component-embedded circuit board 2 taken along line II-II of FIG. 1.

Together with the composite component-embedded circuit board 2, FIG. 2 also illustrates the electrical components 3 defining the module component 1. For ease of illustration, FIG. 2 may illustrate components in different sections, in a strict sense, on the same plane. The electrical components 3 are viewed from the side. These notes are also applied to the other sections, described below.

The composite component 10 is a single chip including a composite circuit, described below. The composite component 10 is embedded in the circuit board 20 with a first main surface, on which first terminal electrodes 121 are disposed, facing upward and a second main surface, on which a second terminal electrode 122 is disposed, facing downward. In the present preferred embodiment, the first terminal electrodes 121 include a first terminal electrode 121 defining an input terminal P1 of a composite circuit, and a first terminal electrode 121 defining an output terminal P2 of the composite circuit. Specifically, the composite component 10 includes multiple first terminal electrodes 121 (here, two first terminal electrodes 121). The second terminal electrode 122 defines and functions as a ground terminal $P_{GND}$ of the composite circuit.

The details of the composite component 10 are described together with the structure of the composite circuit including the composite component 10.

As illustrated in FIGS. 1 and 2, the circuit board 20 is a substrate including a first functional block (e.g., electrical component 3) in a portion closer to its upper surface, and a second functional block (ground pattern conductor 231 in the present preferred embodiment, described below) different from the first functional block in a portion closer to its lower surface. Here, that functional blocks are different from each other refers to, for example, that functional blocks have different structures and thus have different functions. In the present preferred embodiment, the electrical components 3 (first functional block) include or define a signal processing circuit and a matching circuit, and a ground pattern conductor 231 (second functional block) includes a ground. Specifically, the functional blocks preferably include, in addition to circuit elements such as a positive element and a passive element, a simple electrode and a wire. A signal processing circuit and a matching circuit are examples of the first functional block, and the ground is an example of the second functional block.

In the present preferred embodiment, the circuit board 20 is preferably a multilayer substrate including, for example, multiple second base layers vertically laminated together (i.e., in a direction parallel or substantially parallel to the Z axis). In the present preferred embodiment, as illustrated in FIG. 2, the circuit board 20 includes a laminated resin element 21, constructed by vertically (i.e., in a direction parallel or substantially parallel to the Z axis) laminating five thermoplastic resin layers 211 to 215, corresponding to multiple second base layers, and conductors of any of various types disposed on the thermoplastic resin layers 211 to 215. The conductors of various types include pattern conductors 221 and via conductors 222. The pattern conductors 221 are disposed parallel or substantially parallel to the main surfaces of the thermoplastic resin layers 211 to 215 (in X-Y plane). The via conductors 222 extend through the thermoplastic resin layers 211 to 215 in the thickness direction (Z-axis direction).

In the present preferred embodiment, the composite component 10 is disposed in the thermoplastic resin layer 213 of the thermoplastic resin layers 211 to 215 defining the laminated resin element 21. Specifically, the composite component 10 is embedded in the circuit board 20 while being held between the thermoplastic resin layers 212 and 214 on both sides in the thickness direction (both sides in the Z-axis direction), and held by the thermoplastic resin layer 213 in the directions perpendicular or substantially perpendicular to the thickness direction. Specifically, the first functional block is disposed above the composite component 10, and the second functional block is disposed below the composite component 10.

As long as the composite component 10 is embedded in the circuit board 20, the composite component 10 may be disposed in any position. For example, the composite component 10 may be disposed in any of the thermoplastic resin layers 212 to 214 of the thermoplastic resin layers 211 to 215, except the uppermost thermoplastic resin layer 211 and the lowermost thermoplastic resin layer 215. Thus, the layer in which the composite component 10 is to be disposed may be appropriately determined in accordance with, for example, the layout of the pattern conductors 221 and the via conductors 222 that electrically connect the composite component 10 to the first functional block (e.g., electrical components 3), and the composite component 10 to the second functional block (e.g., ground pattern conductor).

Surface electrodes 223 to mount the electrical component 3 are disposed on the upper surface of the circuit board 20. A surface electrode to mount the composite component-embedded circuit board 2 on, for example, a motherboard may be disposed on the lower surface of the circuit board 20.

A ground pattern conductor 231 is disposed at a portion closer to the lower surface of the circuit board 20. Specifically, the ground pattern conductor 231 is disposed in the circuit board 20 below the composite component 10. More specifically, the ground pattern conductor 231 is preferably disposed below the middle of the circuit board 20 in the thickness direction. As long as the ground conductor 231 is disposed below the composite component 10, the ground pattern conductor 231 may be located above the middle of the circuit board 20 in the thickness direction.

In the present preferred embodiment, the ground pattern conductor 231 is disposed in the layers of the circuit board 20, specifically, at the interface between the thermoplastic resin layers 214 and 215. The ground pattern conductor 231 is a solid pattern electrode disposed on the entirety or substantially the entirety of the circuit board 20 when viewed in the thickness direction (viewed in the direction parallel or substantially perpendicular to the Z axis). Specifically, the ground pattern conductor 231 may be locally absent, for example, to avoid the via conductors 222 having a potential different from the ground potential when viewed in the thickness direction.

The ground pattern conductor 231 may be disposed, besides in the layers of the circuit board 20, on the lower surface of the circuit board 20 (that is, on the lower surface of the thermoplastic resin layer 215).

The material of the circuit board 20 is not limited to a particular material. In the present preferred embodiment, the base material of the circuit board 20 is preferably mainly a resin, for example. Specifically, a thermoplastic resin, such as polyimide or a liquid crystalline polymer, for example, is usable for the thermoplastic resin layers 211 to 214 defining the laminated resin element 21 of the circuit board 20. For example, a metal or alloy mainly including copper may be used for the pattern conductors 221, the surface electrodes 223, and the ground pattern conductor 231. The surface electrodes 223 may be plated with, for example, nickel, palladium, or gold. For example, a metal or alloy mainly including tin may be used for the via conductors 222.

Now, the detailed structure of the composite component 10 is described with reference to FIGS. 3 to 6.

Figure 3:
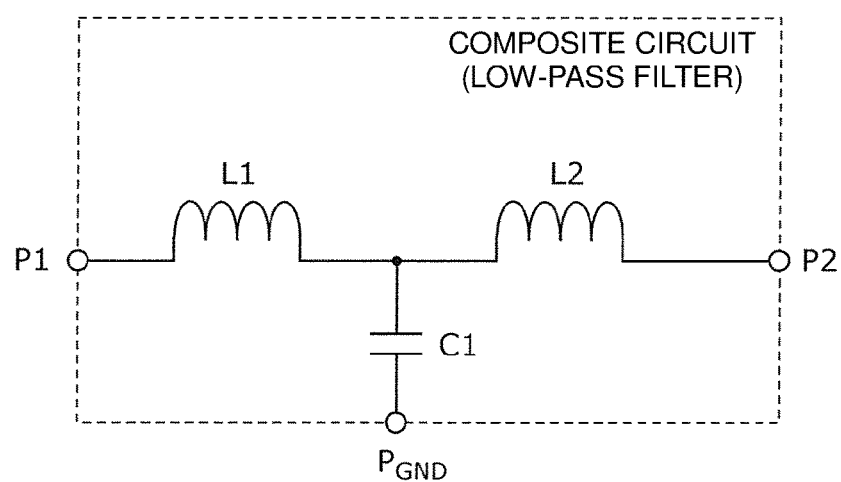
FIG. 3 is a circuit diagram of a circuit structure including a composite component according to a preferred embodiment of the present invention.

The composite component 10 defines a composite circuit including a first circuit element and a second circuit element. In the present preferred embodiment, a low-pass filter illustrated in FIG. 3 is defined as the composite circuit. Here, the composite circuit has a predetermined function and in which the first circuit element and the second circuit element are connected together. FIG. 3 is a circuit diagram illustrating the circuit structure including the composite component 10.

As illustrated in FIG. 3, the composite circuit (here, low-pass filter) includes inductors L1 and L2 and a capacitor C1. The inductors L1 and L2 are serially connected to each other between an input terminal P1 and an output terminal P2. The capacitor C1 shunts the connection node between the inductor L1 and the inductor L2 to the ground terminal $P_{GND}$. Here, "to shunt" means to connect to the ground terminal. Thus, when a circuit element that shunts any node to the ground terminal is disposed, the node and the ground terminal are connected to each other via the circuit element.

Here, each of the inductors L1 and L2 corresponds to the first circuit element of the composite circuit (e.g., low-pass filter), and the capacitor C1 corresponds to the second circuit element of the composite circuit. Specifically, each of the first circuit element and the second circuit element of the composite circuit is a passive element circuit. Specifically, one of the first circuit element and the second circuit element (here, the second circuit element) is a capacitor, and the other circuit element (here, the first circuit element) is an LC composite circuit of the inductor.

The above composite circuit attenuates, from the frequency components included in, for example, a high-frequency signal input from the input terminal P1, frequency components higher than the cutoff frequency defined by the constants of the inductors L1 and L2 and the capacitor C1. The composite circuit then outputs the resultant frequency components to the signal processing circuit from the output terminal P2.

Figure 4:
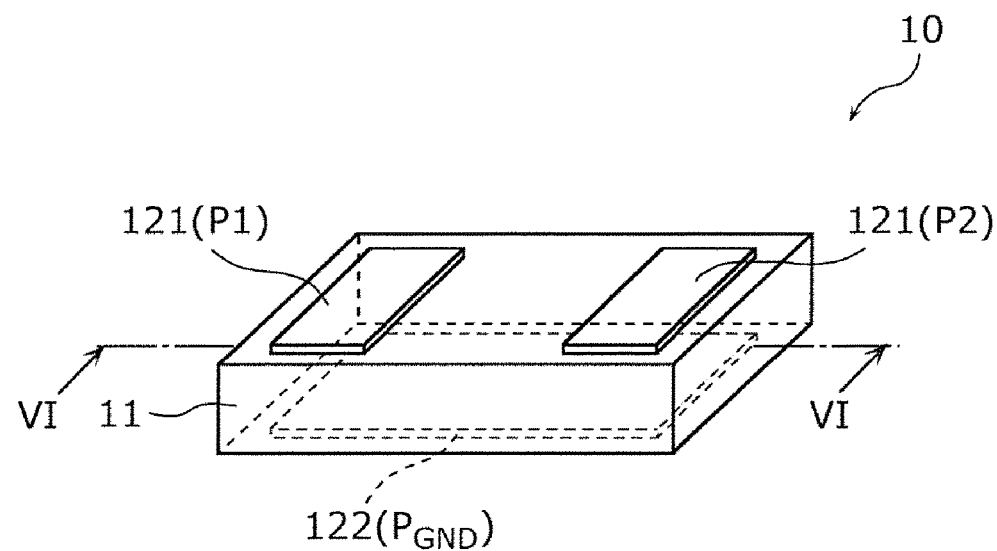
FIG. 4 is a perspective view of the external appearance of a composite component according to a preferred embodiment of the present invention.
Figure 4:
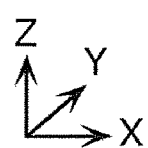

The composite component 10 has an external structure illustrated in FIG. 4. FIG. 4 is a perspective view of the external appearance of the composite component 10.

The first terminal electrodes 121 are preferably flat electrodes disposed on the upper surface of the composite component 10, connected to the composite circuit (e.g., low-pass filter), and connected to the first functional block (electrical components 3). In the present preferred embodiment, the first terminal electrodes 121 are disposed on the upper surface of a laminated ceramic element 11, described below.

On the other hand, the second terminal electrode 122 is preferably a flat electrode disposed on the lower surface of the composite component 10. The second terminal electrode 122 is connected to the composite component circuit, and connected to the second functional block (ground pattern conductor 231). In the present preferred embodiment, the second terminal electrode 122 is disposed on the lower surface of the laminated ceramic element 11. The second terminal electrode 122 is disposed over the entirety or substantially the entirety of the lower surface of the composite component 10. Specifically, the second terminal electrode 122 may be disposed only over the area excluding the peripheral portion of the lower surface of the composite component 10.

Each of the first terminal electrodes 121 and the second terminal electrode 122 is preferably disposed only on the upper or lower surface of the composite component 10, unlike a fold-back electrode (end-surface electrode) disposed from the upper or lower surface to the side surface of a composite component. Specifically, the first terminal electrodes 121 are disposed only within the upper surface of the composite component 10, and the second terminal electrode 122 is disposed only within the lower surface of the composite component 10. This structure is a land grid array (LGA) terminal structure.

The first terminal electrodes 121 and the second terminal electrode 122 defined by flat electrodes prevent electrode size increase, which may increase the parasitic inductance component, and have electrode sizes with which they are reliably electrically connected to the circuit board 20. This structure prevents reduction of the connection reliability and provides intended circuit characteristics.

The first terminal electrodes 121 and the second terminal electrode 122 may be fold-back electrodes, instead of flat electrodes.

Figure 5A:
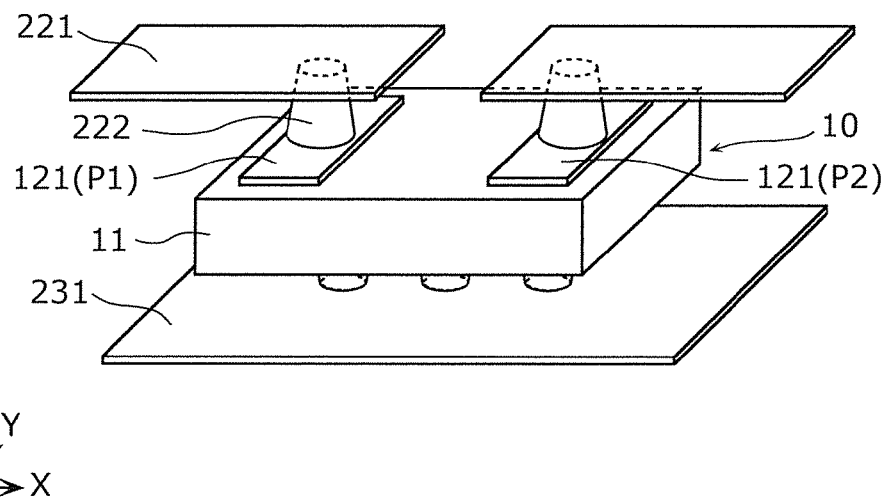
FIG. 5A is a perspective view of a composite component according to a preferred embodiment of the present invention and a conductor around the composite component viewed from above.
Figure 5B:
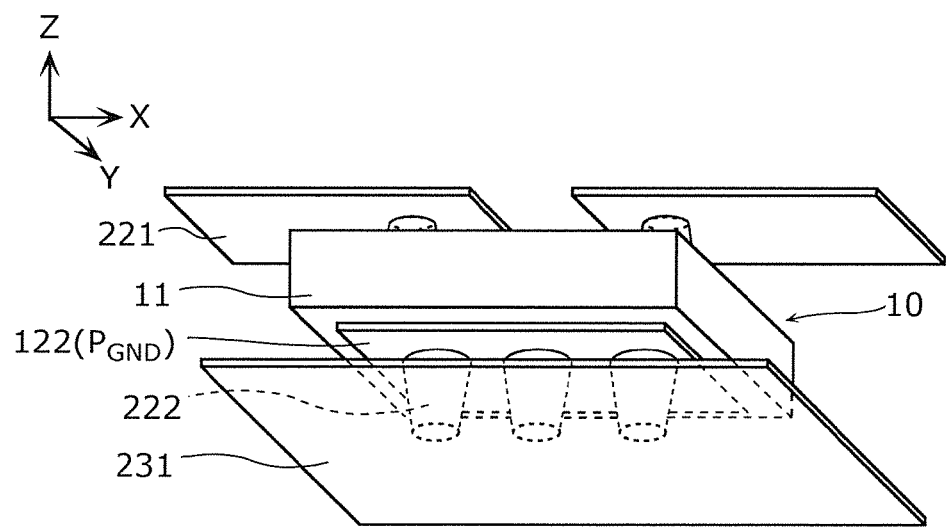
FIG. 5B is a perspective view of a composite component according to a preferred embodiment of the present invention and a conductor around the composite component viewed from below.

FIG. 5A is a perspective view of the composite component 10 and conductors (pattern conductors 221 and via conductors 222) surrounding the composite component 10 viewed from above. FIG. 5B is a perspective view of the composite component 10 and conductors (pattern conductors 221 and via conductors 222) surrounding the composite component 10 viewed from below.

As illustrated in FIGS. 5A and 5B, the first terminal electrodes 121 and the second terminal electrode 122 are directly connected to the via conductors 222 of the circuit board 20. In the present preferred embodiment, the composite component 10 is disposed in the thermoplastic resin layer 213 of the circuit board 20. Thus, each first terminal electrode 121 is directly connected to one via conductor 222 extending through the thermoplastic resin layer 212. The second terminal electrode 122 is directly connected to the three via conductors 222 extending through the thermoplastic resin layer 214. Specifically, the first terminal electrodes 121 are connected to the electrical components 3 with the via conductors 222 and the pattern conductors 221 interposed therebetween. The second terminal electrode 122 is connected to the ground pattern conductor 231 with the via conductors 222 interposed therebetween.

The first terminal electrodes 121 disposed on the upper surface of the composite component 10 are connected to the electrical components 3 disposed above the circuit board 20 with the pattern conductors 221 or the via conductors 222 interposed therebetween. On the other hand, the second terminal electrode 122 disposed on the lower surface of the composite component 10 is connected to the ground pattern conductor 231 disposed below the circuit board 20 with the via conductors 222 interposed therebetween.

In order to reduce the parasitic inductance component, preferably, wiring (that is, the length of the pattern conductors 221 and the via conductors 222) connecting the first terminal electrodes 121 to the electrical components 3 and wiring connecting the second terminal electrode 122 to the ground pattern conductor 231 are short. For example, the wiring route extending from each first terminal electrode 121 to the corresponding electrical component 3 preferably includes only the via conductor 222 extending to the upper layers. The arrangement of the wiring is not limited to this example, and appropriately determined in consideration of, for example, the layout of the wiring and other wiring in the circuit board 20.

The first terminal electrodes 121 and the second terminal electrode 122 overlap at least partially when viewed in a plan (viewed parallel or substantially parallel to the Z-axis direction). In the present preferred embodiment, the entirety or substantially the entirety of the first terminal electrodes 121 overlaps the second terminal electrode 122.

The first terminal electrode 121 defining the input terminal P1 and the first terminal electrode 121 defining the output terminal P2 are preferably symmetrically or substantially symmetrically located on the composite component 10 when viewed in a plan (viewed parallel or substantially parallel to the Z-axis direction). The arrangement of these first terminal electrodes 121 is not limited to this example. The first terminal electrodes 121 may be arranged asymmetrically or substantially symmetrically on the composite component 10 when viewed in a plan.

Preferably, the first terminal electrodes 121 and the second terminal electrode 122 have small areas from the view point of the electric characteristics of the composite circuit (e.g., low-pass filter) including the composite component 10. However, an excessive reduction of the area may cause reduced reliability of connection between the via conductors 222, the first terminal electrodes 121, and the second terminal electrode 122. To improve grounding of the composite component 10, preferably, the second terminal electrode 122 defining the ground terminal $P_{GND}$ has a large area to be connected to a large number of via conductors 222. The areas of the first terminal electrodes 121 and the second terminal electrode 122 are thus appropriately determined in consideration of the electric characteristics and the connection reliability.

Figure 6:
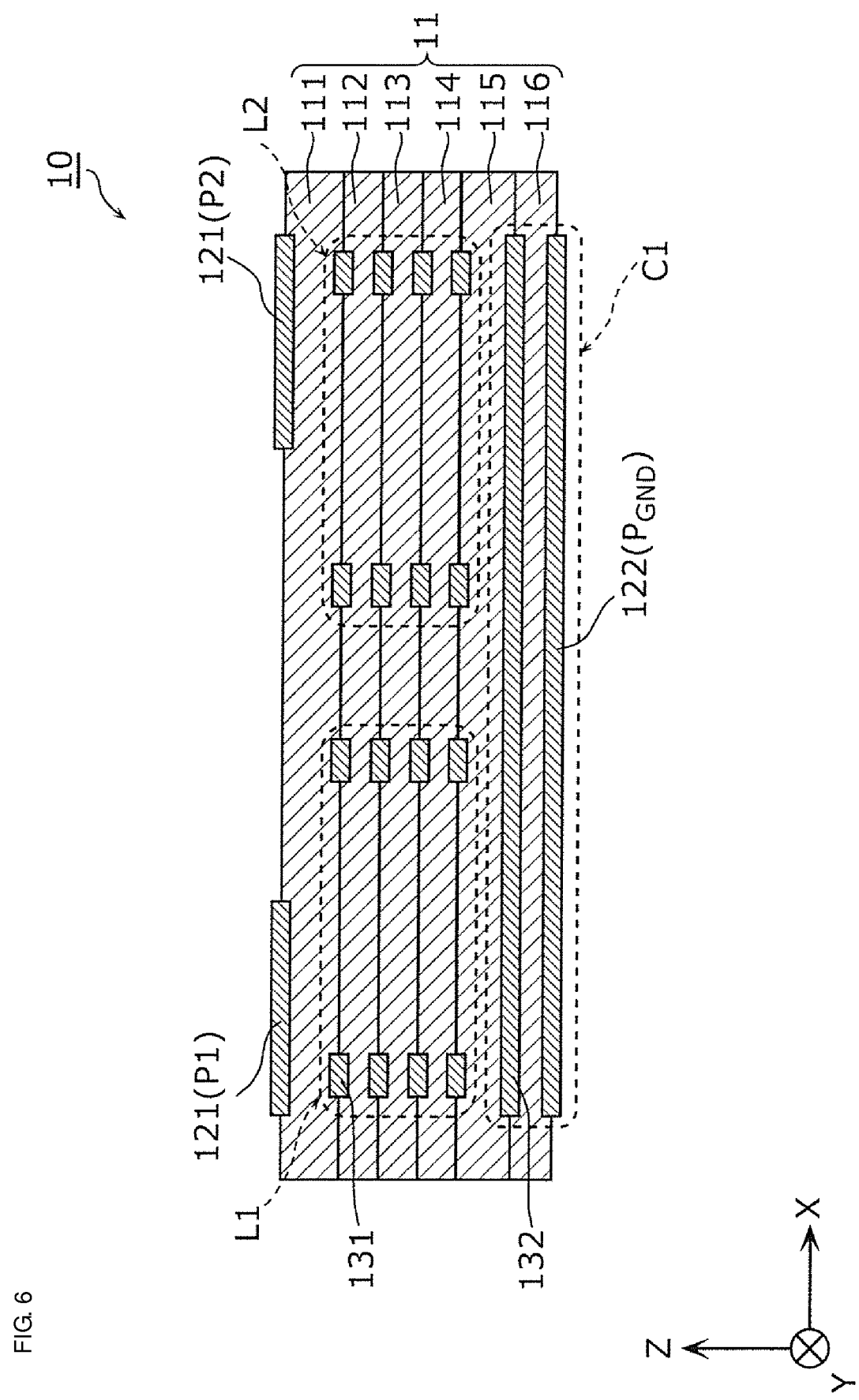
FIG. 6 is a schematic diagram of the sectional structure of a composite component according to a preferred embodiment of the present invention.

Subsequently, the internal structure of the composite component 10 is described. FIG. 6 is a schematic diagram of the sectional structure of the composite component 10.

Specifically, FIG. 6 is a sectional view of the composite component 10 taken along line VI-VI in FIG. 4.

The composite component 10 includes a laminated ceramic element 11, which is a multilayer element constructed by laminating multiple first base layers vertically (direction parallel or substantially parallel to the Z axis). Specifically, the composite component 10 is preferably mainly made of ceramics, for example. As illustrated in FIG. 6, the laminated ceramic element 11 preferably includes six magnetic ceramic layers 111 to 116 laminated together as multiple first base layers, for example.

The laminated ceramic element 11 includes conductors of various types defining the first circuit element and the second circuit element of the composite circuit. In the present preferred embodiment, the conductors of various types include coil conductors 131 and a capacitor conductor 132, which are pattern conductors disposed on the main surfaces of the laminated ceramic element 11, and via conductors (not illustrated) disposed in the lamination direction.

The coil conductors 131 are pattern conductors defining the first circuit element of the composite circuit. In the present preferred embodiment, the coil conductors 131 define the inductors L1 and L2. The coil conductors 131 are preferably, for example, annular or substantially annular pattern conductors when viewed perpendicular or substantially perpendicular to the main surfaces of the laminated ceramic element 11. The coil conductors 131 include end portions connected to coil conductors of other layers with the via conductors interposed therebetween to define the inductors L1 and L2. The shape of the coil conductors 131 is not limited to a particular one. The coil conductors 131 may have, for example, a spiral shape wound multiple times when viewed in the lamination direction of the laminated ceramic element 11.

Here, the inductors L1 and L2 are connected to the first terminal electrodes 121 without the capacitor C1 interposed therebetween. Specifically, the inductor L1 and the capacitor C1 are serially connected in this order between the corresponding first terminal electrode 121 and the second terminal electrode 122. Similarly, the inductor L2 and the capacitor C1 are serially connected in this order between the corresponding first terminal electrode 121 and the second terminal electrode 122. The coil conductors 131 defining the inductors L1 and L2 are one-sidedly located closer to the upper surface of the composite component 10.

Specifically, one or more coil conductors 131 (four coil conductors 131, for example) defining the inductor L1 are one-sidedly located closer to the upper surface of the laminated ceramic element 11. In the present preferred embodiment, the coil conductors 131 are disposed at the interfaces of the upper five magnetic ceramic layers 111 to 115 of the six magnetic ceramic layers 111 to 116. The uppermost coil conductor 131 defining the inductor L1 is connected to the first terminal electrode 121 defining the input terminal P1 with a via conductor (not illustrated) interposed therebetween. On the other hand, the lowermost coil conductor 131 defining the inductor L1 is connected to the upper capacitor conductor 132 defining the capacitor C1 and to the lowermost coil conductor 131 defining the inductor L2 with, for example, pattern conductors and via conductors (not illustrated) defining wiring of the composite circuit interposed therebetween.

One or more coil conductors 131 defining the inductor L2 are disposed on the same layers on which the one or more coil conductors 131 defining the inductor L1 are disposed. The uppermost coil conductor 131 defining the inductor L2 is connected to the first terminal electrode 121 defining the output terminal P2 with a via conductor (not illustrated) interposed therebetween. On the other hand, the lowermost coil conductor 131 defining the inductor L2 is connected to the upper capacitor conductor 132 defining the capacitor C1 and the lowermost coil conductor 131 defining the inductor L1 with, for example, pattern conductors and via conductors (not illustrated) interposed therebetween.

Here, being one-sidedly located refers to being disposed to one side. For example, that one or more coil conductors 131 defining the inductor L1 are one-sidedly located closer to the upper surface means that the center of gravity of the entire one or more coil conductors 131 (here, four coil conductors 131) is located closer to the upper surface than the middle of the laminated ceramic element 11 in the vertical direction. Thus, any of the coil conductors 131 defining the inductor L1 may be located closer to the lower surface than the middle of the laminated ceramic element 11 in the vertical direction. For example, the center of gravity of the entire coil conductors 131 defining the inductor L1 may be calculated using, for example, the length, width, or thickness of the coil conductors 131.

The capacitor conductor 132 is a pattern conductor defining a second circuit element of the composite circuit. In the present preferred embodiment, the capacitor conductor 132 defines the capacitor C1 together with the second terminal electrode 122. Specifically, in the present preferred embodiment, one opposing electrode of a pair of opposing electrodes defining the capacitor C1 includes the second terminal electrode 122, and the other opposing electrode includes the capacitor conductor 132. Thus, the capacitor C1 is connected to the second terminal electrode 122 without using the inductors L1 and L2. The capacitor conductor 132 defining the capacitor C1 is one-sidedly located closer to the lower surface of the composite component 10. Here, a pair of opposing electrodes defining the capacitor C1 may be a pair of capacitor conductors 132 separate from the second terminal electrode 122.

For example, the capacitor conductor 132 may preferably have the same or substantially the same size and shape as the second terminal electrode 122, when viewed perpendicularly or substantially perpendicularly to the main surface of the laminated ceramic element 11. The capacitor conductor 132 is preferably a rectangular or substantially rectangular pattern conductor disposed such that the entirety or substantially the entirety of the capacitor conductor 132 overlaps the second terminal electrode 122.

In the composite component 10, examples used as the magnetic ceramic layers 111 to 116 defining the laminated ceramic element 11 include magnetic ferrite ceramics. Specifically, ferrite including an iron oxide as a main component and including at least one of zinc, nickel, and copper may preferably be used.

For example, a metal or alloy mainly including copper is used as the pattern conductors defining the inductors L1 and L2 and the capacitor C1, the first terminal electrodes 121, and the second terminal electrode 122. The first terminal electrodes 121 and the second terminal electrode 122 may be plated with, for example, nickel, palladium, or gold.

Low temperature co-fired ceramics (LTCC ceramics) having a co-firing temperature lower than the melting point of silver may preferably be used, for example, for the magnetic ceramic layers 111 to 116 defining the laminated ceramic element 11. Thus, the pattern conductors and the via conductors of the composite component 10 may include silver.

The pattern conductors and the via conductors including silver having low resistivity define the composite component 10 having high circuit characteristics, such as power efficiency with a small loss. The pattern conductors and the via conductors made of silver enable co-firing of the composite component 10 under an oxidizing atmosphere, such as under the atmosphere.

Other details such as the material, thickness, and width of the conductors of various types, a pitch between the conductors, and components interposed between the conductors (that is, magnetic ceramic layers) are appropriately determined in consideration of various electric characteristics, such as a cutoff frequency and a quality factor required for the composite circuit including the composite component 10.

The composite component-embedded circuit board 2 having the above-described structure may be manufactured, for example, as follows.

Firstly, ceramic green sheets forming the magnetic ceramic layers 111 to 116 are prepared. Specifically, ceramic green sheets are manufactured by forming slurry including magnetic ceramic powder into sheets.

Subsequently, through holes (via holes) are formed in the ceramic green sheets. The through holes are filled with a conductor paste to form via conductors. A conductor paste including silver as a main component is applied to specific portions on the main surface to be formed into the coil conductors 131 and the capacitor conductor 132.

Subsequently, the ceramic green sheets to which the conductor paste is applied are arranged with each other, laminated, and bonded together into an unfired laminate block. Conductors forming the first terminal electrode 121 and the second terminal electrode 122 are transferred to the unfired laminate block, and they are collectively fired.

Thus, the composite component 10 including a sintered block is formed.

Subsequently, thermoplastic resin sheets forming the thermoplastic resin layers 211 to 215 are prepared. Specifically, thermoplastic resin sheets are manufactured by forming a polyimide or liquid crystalline polymer material before thermosetting into sheets.

Subsequently, a through hole to receive the composite component 10 is formed in the thermoplastic resin sheet forming the thermoplastic resin layer 213. Through holes (via holes) are formed in the other thermoplastic resin sheets. The through holes are filled with the conductor paste to form the via conductors 222. Metal foil is disposed at specific portions of the upper surfaces of the thermoplastic resin sheets to form the pattern conductors 221, the surface electrodes 223, and the ground pattern conductor 231. Here, the through holes may be, for example, formed by laser processing. The conductor paste may be a material including tin. The metal foil may be copper foil or copper alloy foil.

Subsequently, the composite component 10 and the thermoplastic resin sheets receiving the conductor paste and the metal foil are arranged with respect to each other, laminated, bonded, and subjected to heat processing to be integrated together into the composite component-embedded circuit board 2.

Specifically, the thermoplastic resin used for the thermoplastic resin sheets is softened by heating and pressing and flows out to tightly bond the thermoplastic resin sheets and the composite component 10 together. Concurrently, when the via conductors (not sintered yet) of the thermoplastic resin sheets are sintered, the via conductors are metallized, the via conductors and the metal foil are connected together, and the via conductors and the first terminal electrodes 121 and the second terminal electrode 122 of the composite component 10 are connected together.

Specifically, the resin used for the thermoplastic resin layer 212 is engaged in fine unevenness (porous structure) on the surface of the magnetic ceramic layer 111 to form an anchor structure. Thus, the thermoplastic resin layer 212 and the magnetic ceramic layer 111 are mechanically securely joined together. The same applies to the relationship between the thermoplastic resin layer 214 and the magnetic ceramic layer 116.

Through this integration, a metal compound including silver and tin is formed between, for example, each via conductor 222 and the corresponding first terminal electrode 121, and a metal compound including copper and tin is formed between each via conductor 222 and the corresponding pattern conductor 221. Thus, the pattern conductors 221, the via conductors 222, and the first terminal electrodes 121 are mechanically and electrically securely joined together. The same applies to the relationship between the pattern conductors 221, the via conductors 222, and the second terminal electrode 122.

This manufacturing processes forms the composite component-embedded circuit board 2 having high mechanical strength (peel resistance between different materials) and intended circuit characteristics.

Thereafter, the electrical components 3 are mounted on the surface electrodes 223 of the circuit board 20 by, for example, reflow soldering to complete the module component 1 illustrated in FIG. 1 and other drawings.

As described above, in the composite component-embedded circuit board 2 according to the present preferred embodiment, the first terminal electrodes 121 on the upper surface of the composite component 10 are connected to the first functional block (e.g., electrical components 3) disposed closer to the upper surface of the circuit board 20, and the second terminal electrode 122 on the lower surface of the composite component 10 is connected to the second functional block (e.g., ground pattern conductor 231) disposed closer to the lower surface of the circuit board 20. This structure reduces the wiring length of the wiring (e.g., wiring required for the module component 1 to exert its function) required in the circuit board 20. Specifically, the circuit structure required for the circuit board 20 is able to be constructed with the minimum wiring length. Eliminating extra wire routing in the circuit board 20 reduces the parasitic inductance component of the wiring in the circuit board 20, and achieves intended circuit characteristics.

The first terminal electrodes 121 and the second terminal electrode 122 are separately disposed on the upper and lower surfaces, respectively. The size of these electrodes are thus able to be increased. This structure prevents degradation of the reliability of electrical connection of the first terminal electrodes 121 and the second terminal electrode 122 to the circuit board 20, and reduces the parasitic inductance component.

In the composite component-embedded circuit board 2 according to the present preferred embodiment, the composite component 10 is formed by laminating multiple first base layers (six magnetic ceramic layers 111 to 116, for example) together, the first circuit element (e.g., inductors L1 and L2) and the second circuit element (e.g., capacitor C1) include the pattern conductors (e.g., coil conductor 131 and capacitor conductor 132). This structure enables size reduction of the composite component 10. The structure including the composite component 10 therein reduces the stress exerted on the circuit board 20. This structure thus achieves intended circuit characteristics while preventing the circuit board 20 from cracking or causing other defects.

In the composite component-embedded circuit board 2 according to the present preferred embodiment, the pattern conductors (e.g., coil conductors 131) defining the first circuit element are one-sidedly located closer to the upper surface of the composite component 10, and the pattern conductor (e.g., capacitor conductor 132) defining the second circuit element is one-sidedly located closer to the lower surface of the composite component 10. This structure eliminates extra wire routing in the composite component 10, and achieves intended circuit characteristics while reducing the parasitic inductance component of the wiring in the composite component 10.

Particularly, elimination of extra wiring in the composite component 10 is effective for the first circuit element or the second circuit element defining and functioning as a capacitor. Specifically, when the first circuit element or the second circuit element defines and functions as a capacitor, the capacitor and the parasitic inductance component caused by the extra wiring would cause unnecessary resonance. Here, the resonance may cause an unnecessary trap (attenuation pole) in, for example, an intended pass band to fail in achieving intended circuit characteristics. Thus, eliminating the extra wiring to reduce the parasitic inductance component reduces unnecessary resonance and achieves intended circuit characteristics.

In the composite component-embedded circuit board 2 according to the present preferred embodiment, the first functional block is disposed above the composite component 10, and the second functional block is disposed below the composite component 10. This structure enables elimination of extra wire routing in the circuit board 20, and achieves intended circuit characteristics with reduction of the parasitic inductance component of the wiring in the circuit board 20.

In the composite component-embedded circuit board 2 according to the present preferred embodiment, the first terminal electrodes 121 and the second terminal electrode 122 overlap at least partially when viewed in a plan. This structure prevents the composite component 10 from being warped. Warpage of a device embedded in the circuit board generally causes an increase of the stress exerted on the circuit board. This structure that prevents the composite component 10 from being warped to reduce stress exerted on the circuit board 20 thus achieves intended circuit characteristics while reducing cracks or other defects in the circuit board 20.

In the composite component-embedded circuit board 2 according to the present preferred embodiment, the composite component 10 includes multiple first terminal electrodes 121. Thus, the composite circuit including the composite component 10 and the first functional block are able to be connected together with multiple wiring routes in the circuit board 20. This structure improves flexible arrangement of components, such as wiring and circuit elements defining the first functional block (e.g., electrical component 3) in the composite component-embedded circuit board 2.

In the composite component-embedded circuit board 2 according to the present preferred embodiment, each first terminal electrode 121 defines and functions as the input terminal P1 or the output terminal P2, and the second terminal electrode 122 defines and functions as the ground terminal $P_{GND}$. This structure allows a positive element, such as the first functional block (e.g., electrical component 3) including a signal processing circuit to be disposed only on the side of the circuit board 20 closer to the upper surface.

This structure prevents the number of processes for manufacturing the composite component-embedded circuit board 2 from increasing.

In the composite component-embedded circuit board 2 according to the present preferred embodiment, the second terminal electrode 122 is disposed over the entirety or substantially the entirety of the lower surface of the composite component 10. This structure enables firm electrical connection between the second terminal electrode 122 and the circuit board 20. Specifically, grounding of the second terminal electrode 122 is improved to achieve intended circuit characteristics.

In the composite component-embedded circuit board 2 according to the present preferred embodiment, the circuit board 20 is a multilayer substrate including multiple second base layers (preferably five thermoplastic resin layers 211 to 215, for example), and the second functional block is the inner ground pattern conductor 231. This structure reduces wire routing between the second terminal electrode 122 and the ground pattern conductor 231 and reduces the parasitic inductance component of the wiring to achieve intended circuit characteristics. This structure is particularly effective in improving high-frequency characteristics for the composite component-embedded circuit board 2 to be used as, for example, a high frequency module component.

In the composite component-embedded circuit board 2 according to the present preferred embodiment, the signal processing circuit includes each electrical component 3 (e.g., RFIC 31) mounted on the upper surface of the circuit board 20. This structure enables space saving of the composite component-embedded circuit board 2 (e.g., module component 1) including the electrical component 3. This structure is particularly effective for the module component 1 mounted on, for example, a portable terminal device requiring space saving and high density mounting.

In the composite component-embedded circuit board 2 according to the present preferred embodiment, the composite circuit is preferably an LC composite circuit, for example. This structure provides the composite component-embedded circuit board in which a composite component is embedded, the composite component defining, for example, an LC filter such as a low-pass filter, a bandpass filter, or a high-pass filter, or a diplexer that is a combination of these filters.

In the composite component-embedded circuit board 2 according to the present preferred embodiment, one opposing electrode of a pair of opposing electrodes defining the capacitor C1 includes the first terminal electrodes 121 or the second terminal electrode 122 (e.g., second terminal electrode 122). This structure enables a reduction in thickness (or a reduction in height) of the composite component 10, and also a reduction in thickness of the composite component-embedded circuit board 2.

In the composite component-embedded circuit board 2 according to the present preferred embodiment, the base material of the composite component 10 preferably mainly includes ceramics, for example. Thus, the composite component 10 is a sintered body obtained through co-firing.

In the composite component-embedded circuit board 2 according to the present preferred embodiment, the base material of the circuit board 20 preferably mainly includes a resin, for example. When, for example, the resin is a thermoplastic resin, the circuit board 20 (e.g., composite component-embedded circuit board 2) in which the composite component 10 is embedded is able to be manufactured by placing the composite component 10 in the resin material before thermosetting, and subjecting the resultant material to heat treatment.

Figure 7:
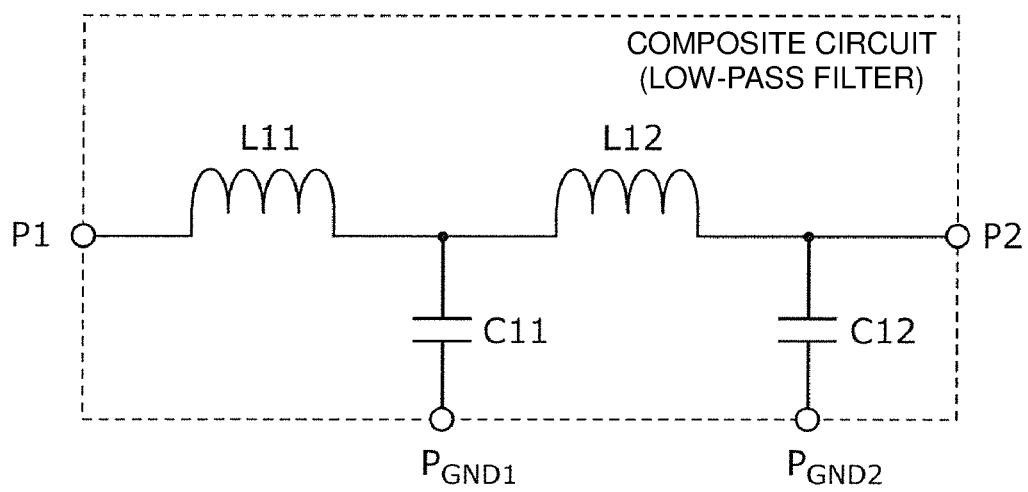
FIG. 7 is a circuit diagram of a circuit structure including a composite component according to a modified example 1 of a preferred embodiment of the present invention.

The structures of the composite component and the composite circuit including the composite component are not limited to the above-described preferred embodiments. A structure of a composite component 10A according to a modified example 1 of a preferred embodiment of the present invention is described with reference to FIGS. 7 and 8. The composite component 10A according to the modified example 1 includes two steps of low-pass filters illustrated in FIG. 7 as a composite circuit. FIG. 7 is a circuit diagram of the circuit structure of the composite component 10A according to the modified example 1 of a preferred embodiment of the present invention.

As illustrated in FIG. 7, the composite circuit (low-pass filter, here) includes inductors L11 and L12 and capacitors C11 and C12. The inductors L11 and L12 are serially connected between the input terminal P1 and the output terminal P2. The capacitors C11 and C12 respectively shunt the nodes of the inductors L11 and L12 closer to the output terminal P2 to ground terminals $P_{GND1}$ and $P_{GND2}$. Here, the inductors L11 and L12 correspond to the first circuit elements of the composite circuit (low-pass filters in the modified example 1). The capacitors C11 and C12 correspond to the second circuit elements of the composite circuit.

The composite circuit having the above-described structure attenuates, of frequency components included in, for example, a high-frequency signal input from the input terminal P1, frequency components higher than a first cutoff frequency, defined by the constants of the inductor L11 and the capacitor C11, and a second cutoff frequency, defined by the constants of the inductor L12 and the capacitor C12. The composite circuit then outputs the resultant frequency components to the signal processing circuit from the output terminal P2.

Figure 8:
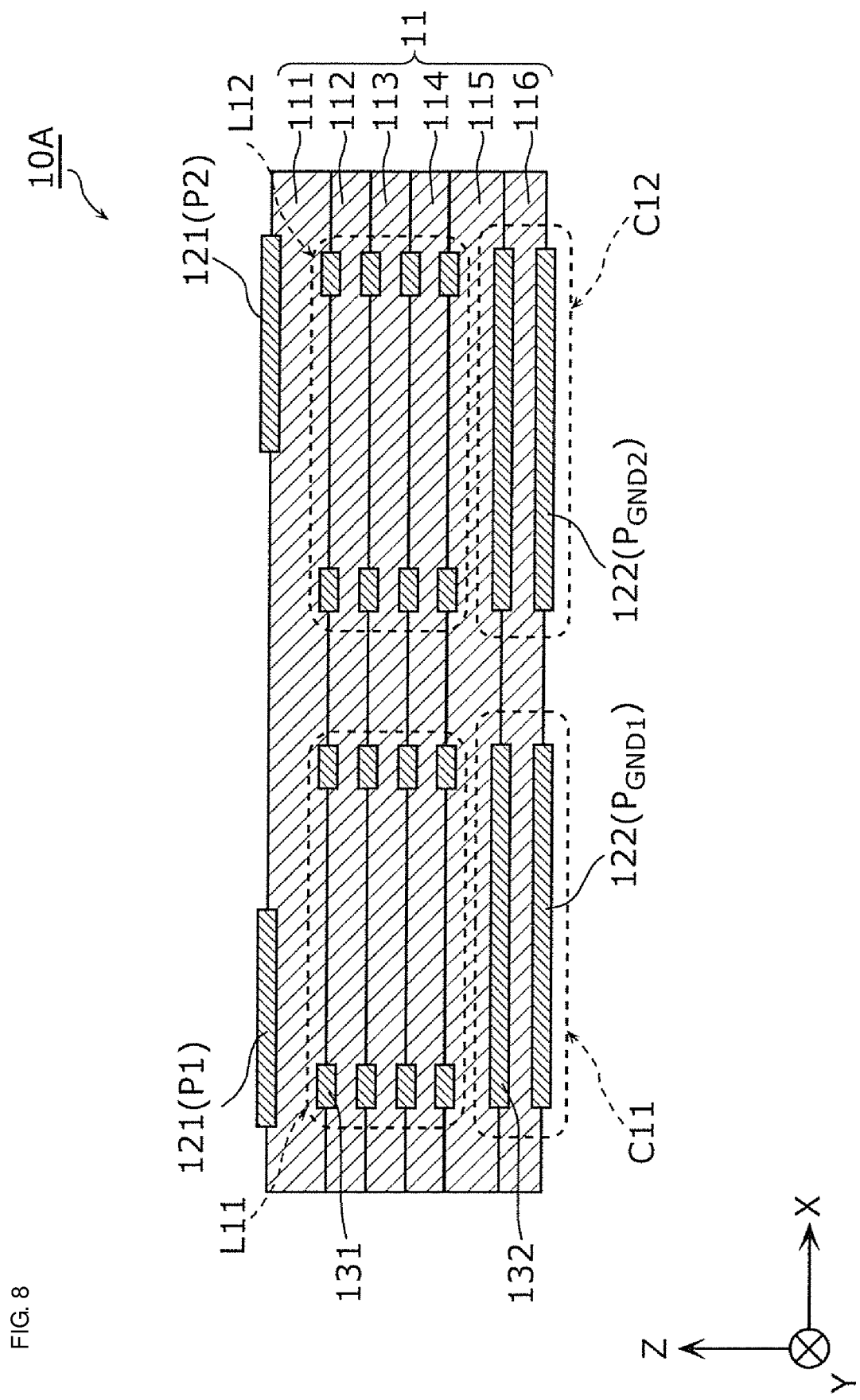
FIG. 8 is a schematic diagram of the sectional structure of the composite component according to the modified example 1.

FIG. 8 is a schematic diagram of the sectional structure of the composite component 10A according to the modified example 1 of a preferred embodiment of the present invention. Specifically, FIG. 8 is a sectional view of the composite component 10A taken along line VI-VI in FIG. 4.

As illustrated in FIG. 8, with the difference in circuit structure, the composite component 10A is different from the composite component 10 illustrated in FIG. 6 in that it includes a capacitor conductor 132 defining a capacitor C11 and a capacitor conductor 132 defining a capacitor C12. Here, the capacitor conductor 132 defining the capacitor C12 is connected, with via conductors (not illustrated) interposed therebetween, to the uppermost coil conductor 131 defining the inductor L12 and the first terminal electrode 121 defining the output terminal P2.

The present modified example includes multiple (for example, two) second terminal electrodes 122. Specifically, it separately includes a second terminal electrode 122 defining one opposing electrode of a pair of opposing electrodes of the capacitor C11, and a second terminal electrode 122 defining one opposing electrode of a pair of opposing electrodes of the capacitor C12. These two second terminal electrodes 122 respectively define ground terminals $P_{GND1}$ and $P_{GND2}$.

In the present modified example, the two second terminal electrodes 122 define the ground terminals $P_{GND1}$ and $P_{GND2}$ with the same potential, and thus may be integrated into one electrode. When the second terminal electrodes 122 are integrated into one electrode, more via conductors 222 are able to be connected to the second terminal electrode 122, and grounding of the second terminal electrode 122 is improved. This structure, on the other hand, may cause another problem of an increase of the parasitic inductance component of the second terminal electrodes 122. Thus, whether to integrate the second terminal electrodes 122 into one electrode is a matter appropriately determined in consideration of circuit characteristics, such as high-frequency characteristics required for the composite component 10A.

The composite component-embedded circuit board including the composite component 10A having the above structure also has the same or substantially the same advantageous effects as the preferred embodiment described above. Specifically, this structure eliminates extra wire routing and reduces the parasitic inductance component of the wiring to achieve intended circuit characteristics.

The composite circuit including the composite component of the composite component-embedded circuit board may preferably be a high-pass filter, for example. The structures of a composite component-embedded circuit board 2B according to a modified example 2 of a preferred embodiment of the present invention and a composite component 10B are described with reference to FIGS. 9 to 11.

Figure 9:
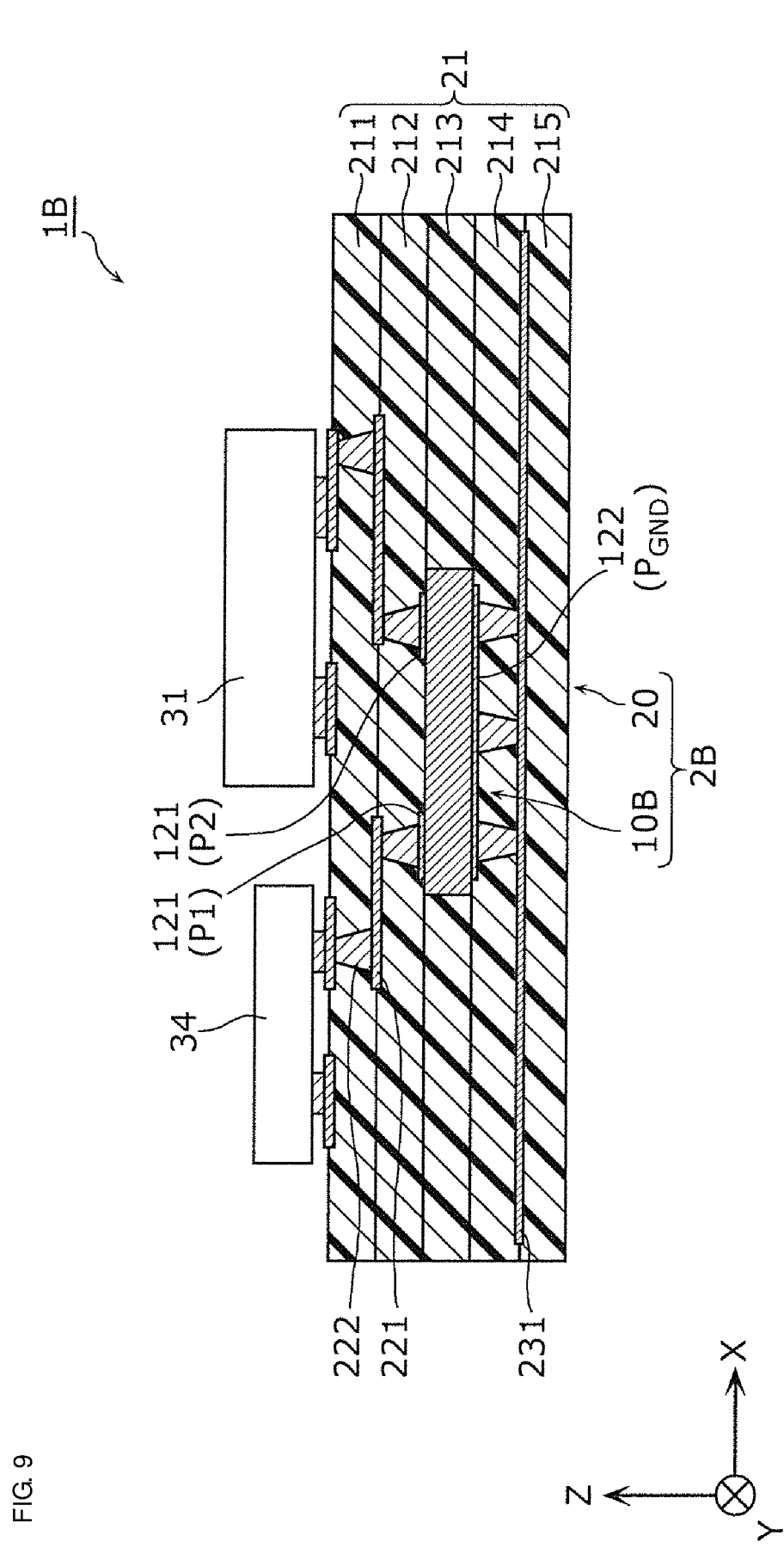
FIG. 9 is a schematic diagram of the sectional structure of a composite component-embedded circuit board according to a modified example 2 of a preferred embodiment of the present invention.

FIG. 9 is a schematic diagram of the sectional structure of the composite component-embedded circuit board 2B according to the modified example 2 of a preferred embodiment. Specifically, FIG. 9 is a sectional view of the composite component-embedded circuit board 2B taken along line II-II of FIG. 1. In addition to the composite component-embedded circuit board 2B, FIG. 9 also illustrates a RFIC 31 and a switch IC 34, which are semiconductor integrated circuit elements defining a module component 1B.

The switch IC 34 is, for example, a high frequency switch IC connected to the first terminal electrode 121 constituting the input terminal P1 of the composite component 10B.

Figure 10:
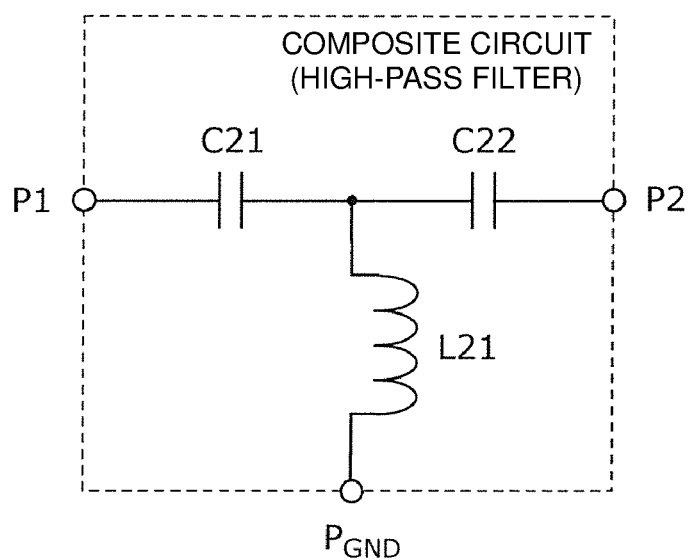
FIG. 10 is a circuit diagram of a circuit structure including a composite component according to the modified example 2.

The composite component 10B according to this modified example defines a high-pass filter illustrated in FIG. 10 as a composite circuit. FIG. 10 is a circuit diagram of the circuit structure including the composite component 10B according to the modified example 2 of a preferred embodiment of the present invention.

As illustrated in FIG. 10, the composite circuit (high-pass filter, here) includes capacitors C21 and C22 and an inductor L21. The capacitors C21 and C22 are serially connected between the input terminal P1 and the output terminal P2. The inductor L21 shunts the connection node between the capacitor C21 and the capacitor C22 to the ground terminal $P_{GND}$. Here, the capacitors C21 and C22 correspond to the first circuit elements of the composite circuit (e.g., high-pass filter), and the inductor L21 corresponds to the second circuit element of the composite circuit.

The composite circuit having the above-described structure attenuates, from the frequency components included in, for example, a high-frequency signal input from the input terminal P1, frequency components lower than the cutoff frequency defined by the constants of the capacitors C21 and C22 and the inductor L21. The composite circuit then outputs the resultant frequency components to the signal processing circuit from the output terminal P2.

Figure 11:
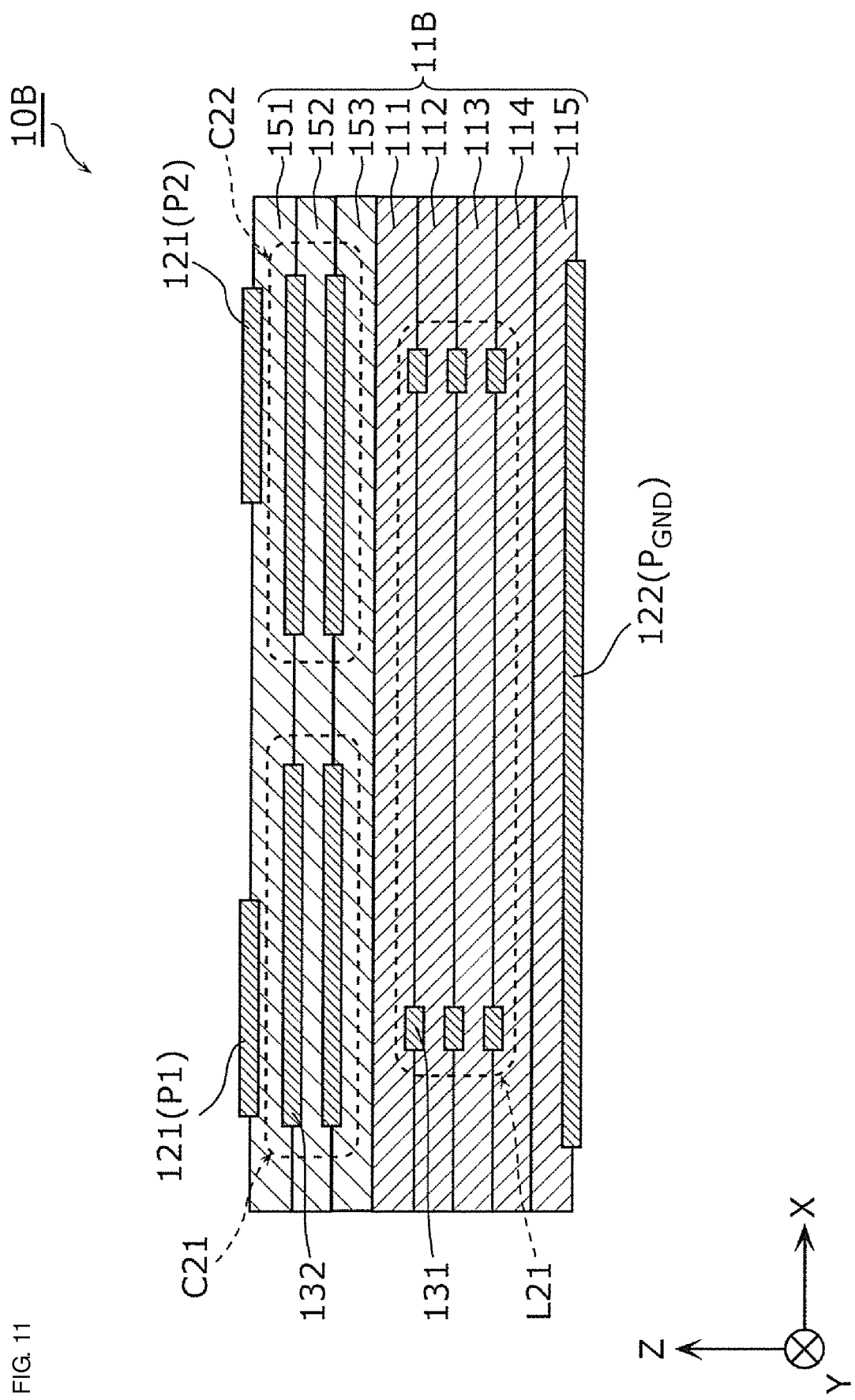
FIG. 11 is a schematic diagram of the sectional structure of a composite component according to the modified example 2.

FIG. 11 is a schematic diagram of the sectional structure of the composite component 10B according to the modified example 2 of a preferred embodiment of the present invention. Specifically, FIG. 11 is a sectional view of the composite component 10B taken along line VI-VI in FIG. 4.

As illustrated in FIG. 11, the composite component 10B is different from the composite component 10 illustrated in FIG. 6 in that it includes a laminated ceramic element 11B, instead of the laminated ceramic element 11, and with the difference in circuit structure, the coil conductor 131 and capacitor conductor 132 are located at different positions in the lamination direction.

The laminated ceramic element 11B preferably includes, as multiple first base layers, three dielectric layers 151 to 153, and five magnetic ceramic layers 111 to 115, for example, which are laminated together.

The dielectric layers 151 to 153 are preferably, for example, non-magnetic ceramic layers made of non-magnetic ferrite ceramics or insulating glass ceramics including alumina and glass as main components, for example. The dielectric layers 151 to 153 may be thermoplastic resin layers made of resin as a main component.

In the present modified example, the coil conductors 131 are one-sidedly located closer to the lower surface of the composite component 10B. This is because the inductor L21 including the coil conductors 131 is connected to the ground terminal $P_{GND}$ including the second terminal electrode 122 without using the capacitors C21 and C22.

In the present modified example, the capacitor conductors 132 are one-sidedly located closer to the upper surface of the composite component 10B. This is because the capacitors C21 and C22 including the capacitor conductors 132 are connected to the input terminal P1 or the output terminal P2 including the first terminal electrodes 121 without using the inductor L21. Specifically, the capacitor C21 and the inductor L21 are serially connected in this order between the corresponding first terminal electrode 121 and the second terminal electrode 122. Similarly, the capacitor C22 and the inductor L21 are serially connected in this order between the corresponding first terminal electrode 121 and the second terminal electrode 122.

In the present modified example, the capacitor conductors 132 are disposed in the layers of the laminate structure including the dielectric layers 151 to 153. This structure further reduces the area of the capacitor conductors 132 to achieve an intended capacitance value than in the case in which the capacitor conductors 132 are disposed in the layers of the laminate structure including magnetic ceramic layers.

The composite component-embedded circuit board 2B including the composite component 10B having the above-described structure also has the same or substantially the same advantageous effects as the above-described preferred embodiment. Specifically, this structure eliminates extra wire routing and reduces the parasitic inductance component of the wiring to achieve intended circuit characteristics.

Alternatively, the composite circuit including the composite component of the composite component-embedded circuit board may preferably be a bandpass filter, for example. The structures of a composite component-embedded circuit board 2C according to a modified example 3 of a preferred embodiment of the present invention and a composite component 10C are described with reference to FIGS. 12 and 13.

Figure 12:
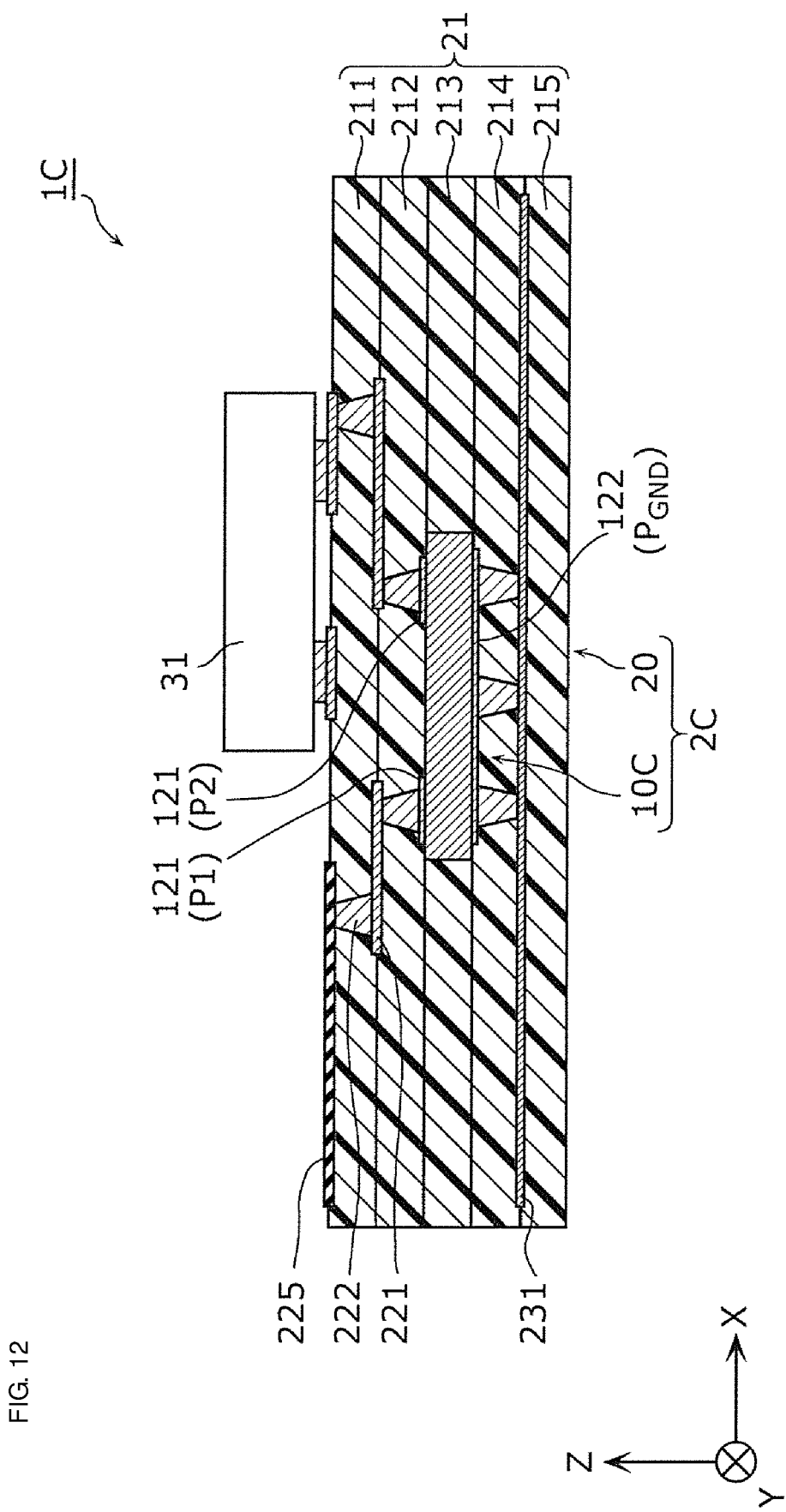
FIG. 12 is a schematic diagram of the sectional structure of a composite component-embedded circuit board according to a modified example 3 of a preferred embodiment of the present invention.

FIG. 12 is a schematic diagram of the sectional structure of the composite component-embedded circuit board 2C according to the modified example 3 of a preferred embodiment of the present invention. Specifically, FIG. 12 is a sectional view of the composite component-embedded circuit board 2C taken along line II-II of FIG. 1. FIG. 12 illustrates an RFIC 31, which is an electrical component defining a module component 1C, in addition to the composite component-embedded circuit board 2C.

In the composite component-embedded circuit board 2C illustrated in FIG. 12, an antenna connection wiring 225 defining wiring connected to an antenna (not illustrated) is disposed on the upper surface of the circuit board 20. The antenna connection wiring 225 corresponds to a first functional block according to the present modified example. The antenna connection wiring 225 is a pattern conductor connected to the first terminal electrode 121 defining the input terminal P1 of the composite component 10C with the corresponding via conductor 222 and the corresponding pattern conductor 221 interposed therebetween.

Figure 13:
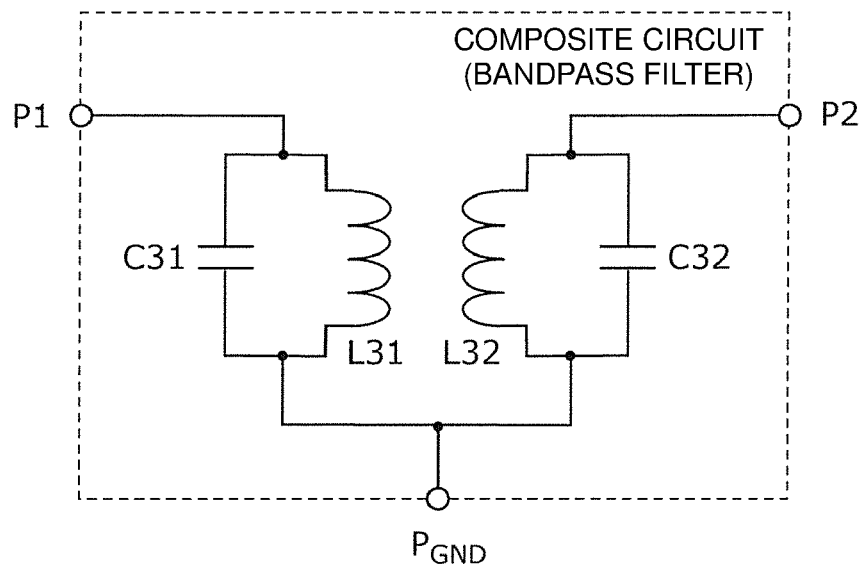
FIG. 13 is a circuit diagram of a circuit structure including a composite component according to the modified example 3.

The composite component 10C according to the present modified example defines a bandpass filter illustrated in FIG. 13 as a composite circuit. FIG. 13 is a circuit diagram of the circuit structure of the composite component 10C according to the modified example 3 of a preferred embodiment.

As illustrated in FIG. 13, the composite circuit (bandpass filter, here) includes, between the input terminal P1 and the output terminal P2, a capacitor C31 and an inductor L31, which are connected in parallel, and a capacitor C32 and an inductor L32, which are connected in parallel. The node between parallel LC resonance filters each including the capacitor and the inductor connected in parallel is shunted to the ground terminal $P_{GND}$. Here, either one of the pairs of the capacitor and the inductor connected in parallel corresponds to the first circuit element of the composite circuit (high-pass filter in the present modified example), and the other one of the pairs of the capacitor and the inductor connected in parallel corresponds to the second circuit element of the composite circuit.

The above-described composite circuit attenuates, from the frequency components included in, for example, a high-frequency signal input from the input terminal P1, frequency components in the frequency band around the first attenuation pole defined by the constants of the capacitor C31 and the inductor L31 and the frequency components in the frequency band around the second attenuation pole defined by the constants of the capacitor C32 and the inductor L32. The composite circuit then outputs the resultant frequency components to the signal processing circuit from the output terminal P2.

The number of steps of the parallel LC resonance filters defining the bandpass filter is not limited to two, and may be appropriately determined in accordance with, for example, the pass band required for the composite component 10C.

The composite component-embedded circuit board 2C including the composite component 10C having the above-described structure also achieves the same or substantially the same advantageous effects as the above-described preferred embodiment. Specifically, this structure eliminates extra wire routing and reduces the parasitic inductance component of the wiring to achieve intended circuit characteristics.

The composite circuit including the composite component of the composite component-embedded circuit board may preferably be a diplexer, for example. The structures of a composite component-embedded circuit board 2D according to a modified example 4 of a preferred embodiment of the present invention and a composite component 10D are described with reference to FIGS. 14 to 17.

Figure 14:
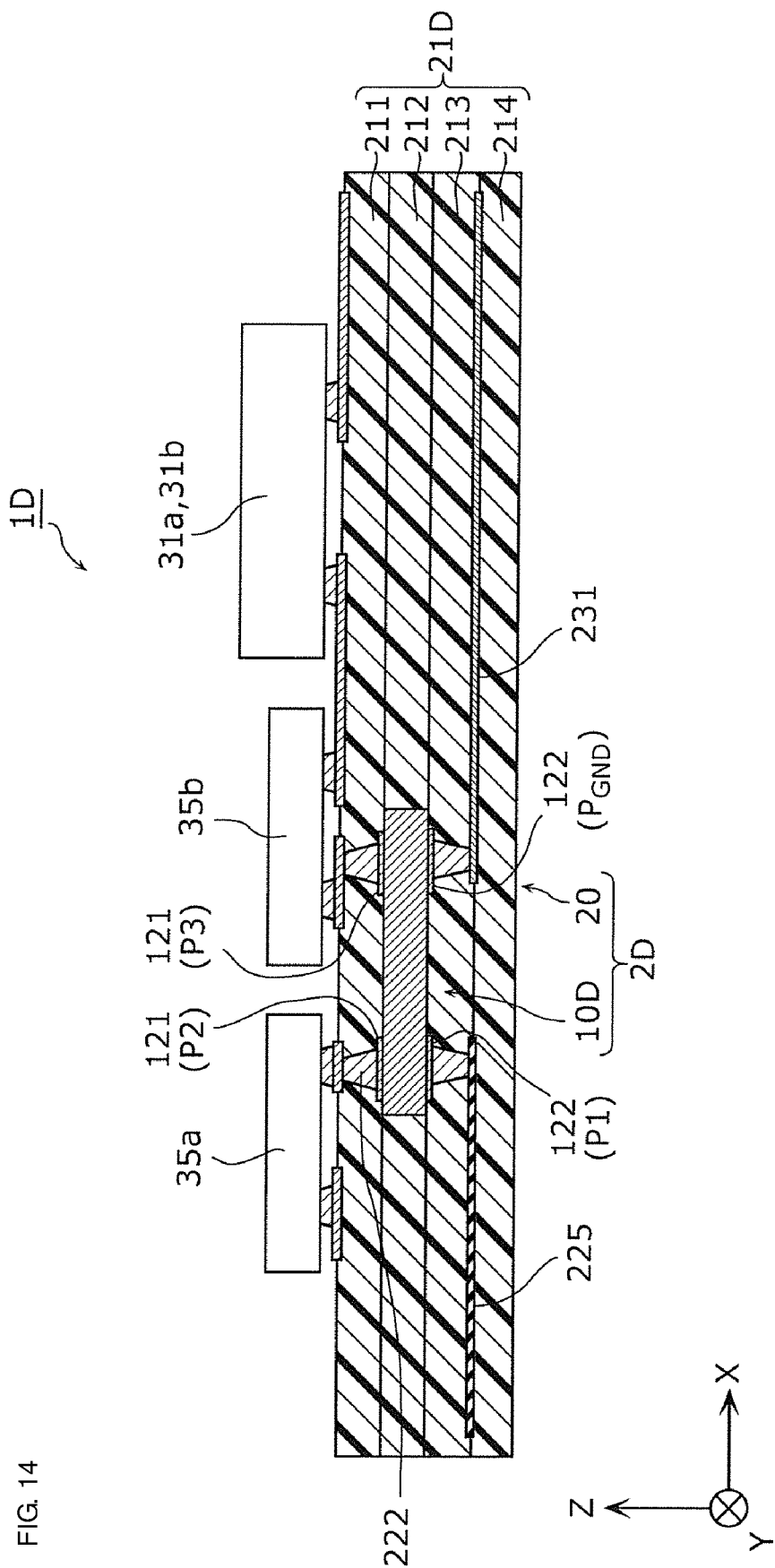
FIG. 14 is a schematic diagram of the sectional structure of a composite component-embedded circuit board according to a modified example 4 of a preferred embodiment of the present invention.

FIG. 14 is a schematic diagram of the sectional structure of the composite component-embedded circuit board 2D according to the modified example 4 of a preferred embodiment of the present invention. Specifically, FIG. 14 is a sectional view of the composite component-embedded circuit board 2D taken along line II-II of FIG. 1. FIG. 14 illustrates, in addition to the composite component-embedded circuit board 2D, various types of electrical components defining a module component 1D. The various types of electrical components preferably include a low-band (LB) RFIC 31*a*, defining a LB signal processing circuit, a high-band (HB) RFIC 31*b*, defining a HB signal processing circuit, a LB surface acoustic wave (SAW) filter 35*a*, defining a LB bandpass filter, and a HB SAW filter 35*b*, defining a HB bandpass filter. The LB RFIC 31*a* and the HB RFIC 31*b* are arranged side by side in the Y-axis direction.

The composite component-embedded circuit board 2D illustrated in FIG. 14 includes a laminated resin element 21D preferably including, for example, four thermoplastic resin layers 211 to 214 that are vertically laminated. The composite component 10D is disposed in a thermoplastic resin layer 212. Thus, the various types of electrical components and the composite component 10D are connected to the via conductors 222 without using the pattern conductors 221.

In the composite component-embedded circuit board 2D, an antenna connection wiring 225 defining wiring connected to an antenna (antenna ANT in FIG. 15) is disposed in the layers of the circuit board 20. The antenna connection wiring 225 corresponds to the second functional block of the present modified example. The antenna connection wiring 225 is a pattern conductor connected to the second terminal electrode 122 defining the input terminal P1 of the composite component 10D with the corresponding via conductor 222 interposed therebetween.

Figure 15:
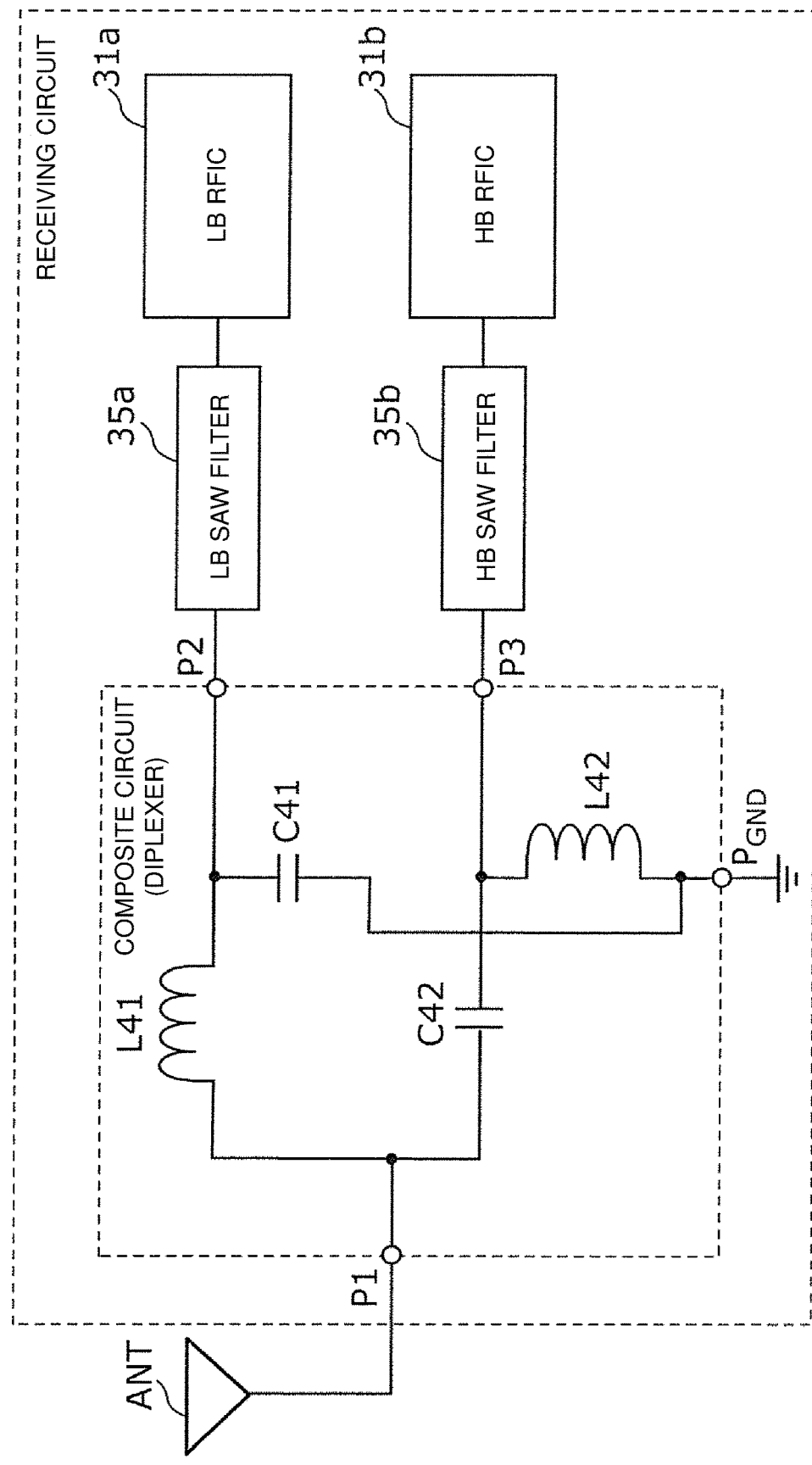
FIG. 15 is a circuit diagram of a circuit structure of a composite component according to the modified example 4.

The composite component 10D according to the present modified example defines a diplexer illustrated in FIG. 15 as a composite circuit. FIG. 15 is a circuit diagram of the circuit structure of the composite component 10D according to the modified example 4 of a preferred embodiment of the present invention. FIG. 15 also illustrates the circuit structure (receiving circuit) of the module component 1D including the composite component-embedded circuit board 2D and various types of electrical components mounted on the composite component-embedded circuit board 2D.

As illustrated in FIG. 15, the composite circuit (diplexer, here) includes a low-pass filter disposed between the LB output terminal P2 and the input terminal P1 connected to the antenna ANT, and a high-pass filter disposed between the input terminal P1 and the HB output terminal P3. The low-pass filter includes an inductor L41 and a capacitor C41. The inductor L41 is serially connected between the input terminal P1 and the LB output terminal P2. The capacitor C41 shunts the node of the inductor L41 closer to the output terminal P2 to the ground terminal P$_{GND}$. The high-pass filter includes a capacitor C42 and an inductor L42. The capacitor C42 is serially connected between the input terminal P1 and the HB output terminal P3. The inductor L42 shunts the node of the capacitor C42 closer to the output terminal P3 to the ground terminal P$_{GND}$.

Here, the capacitor C41 and the inductor L42 correspond to first circuit elements of the composite circuit (e.g., diplexer), and the inductor L41 and the capacitor C42 correspond to second circuit elements of the composite circuit.

The above-described composite circuit attenuates, from the frequency components included in, for example, a high-frequency signal input from the input terminal P1, frequency components higher than the first cutoff frequency defined by the constants of the inductor L41 and the capacitor C41. The composite circuit then outputs the resultant frequency components to a LB signal processing circuit from the output terminal P2. The above-described composite circuit also attenuates frequency components lower than the second cutoff frequency defined by the constants of the capacitor C42 and the inductor L42. The composite circuit then outputs the resultant frequency components to a HB signal processing circuit from the output terminal P3.

Figure 16:
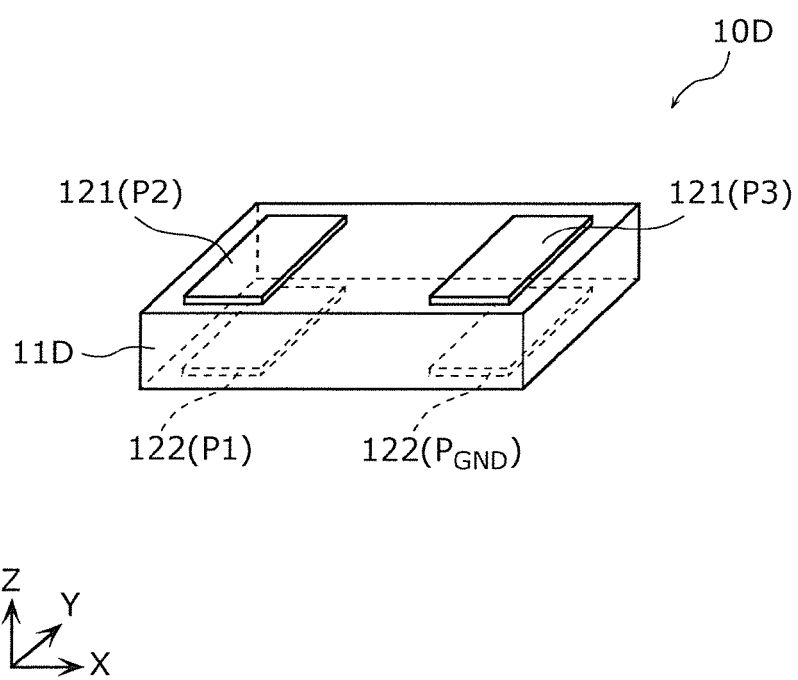
FIG. 16 is a perspective view of the external appearance of the composite component according to the modified example 4.

FIG. 16 is a perspective view of the external appearance of the composite component 10D.

As illustrated in FIG. 16, in the composite component 10D, the first terminal electrodes 121 and the second terminal electrodes 122 overlap each other in a plan view, and preferably, are completely or substantially completely superposed with one another other. This structure further prevents the composite component 10D from being warped.

Figure 17:
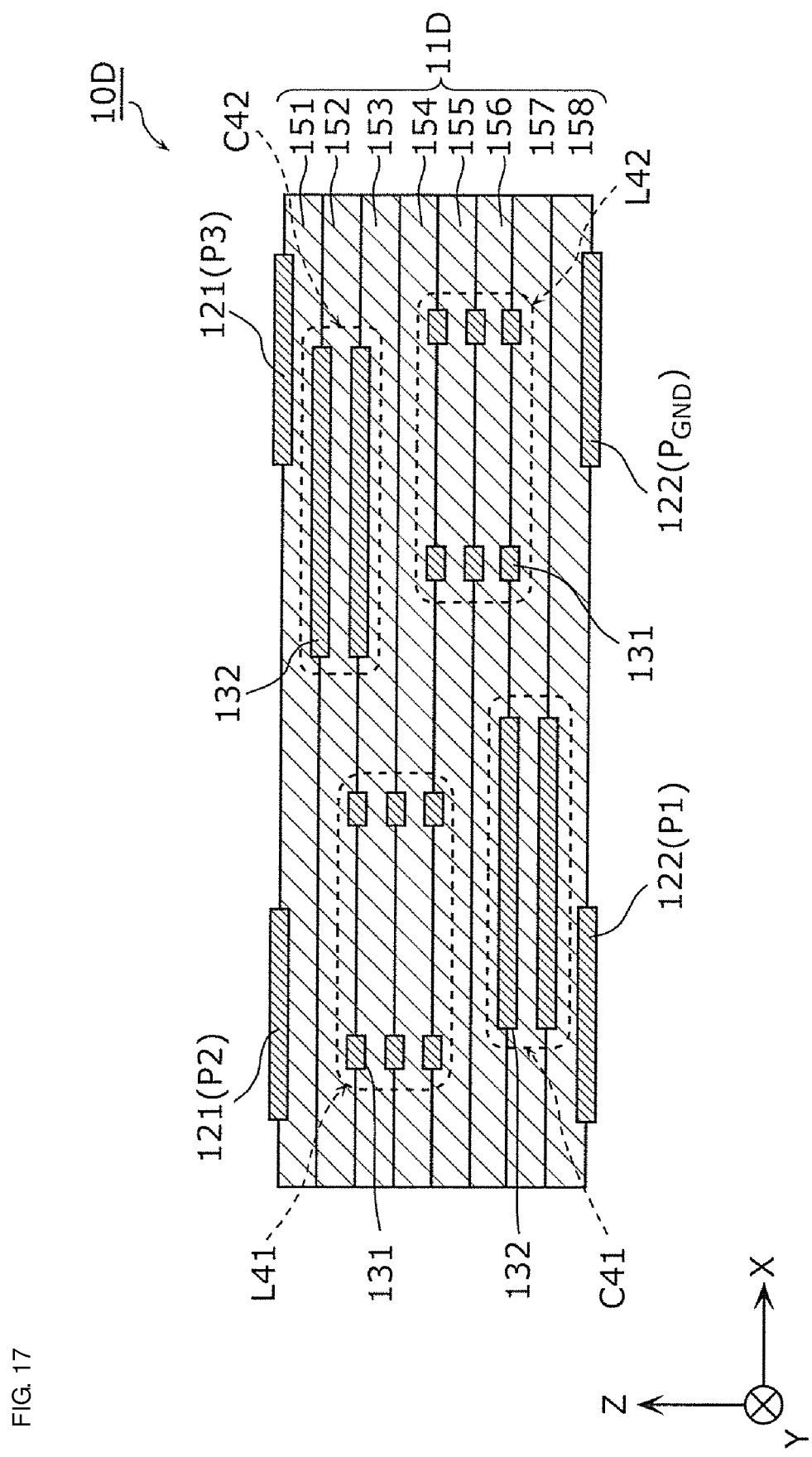
FIG. 17 is a schematic diagram of the sectional structure of a composite component according to the modified example 4.

FIG. 17 is a schematic diagram of the sectional structure of the composite component 10D according to the modified example 4 of a preferred embodiment of the present invention. Specifically, FIG. 17 is a sectional view of the composite component 10D taken along line VI-VI of FIG. 4.

As illustrated in FIG. 17, the composite component 10D is different from the composite component 10 illustrated in FIG. 6 in that it includes a laminated ceramic element 11D, instead of the laminated ceramic element 11, and, with the difference in circuit structure, the coil conductor 131 and the capacitor conductor 132 are located at different positions in the lamination direction.

The laminated ceramic element 11D preferably includes, for example, eight dielectric layers 151 to 158 that are laminated together as multiple first base layers.

In the present modified example, the capacitor conductors 132 defining the capacitor C41 and the coil conductors 131 defining the inductor L42 are one-sidedly located closer to the lower surface of the composite component 10D, and the coil conductors 131 defining the inductor L41 and the capacitor conductor 132 defining the capacitor C42 are one-sidedly located closer to the upper surface of the composite component 10D. This is because the capacitor C41 and the inductor L42 are connected to the ground terminal P$_{GND}$ including the second terminal electrode 122 without using the inductor L41 and the capacitor C42.

The composite component-embedded circuit board 2D including the composite component 10D having the above-described structure also achieves the same or substantially the same effects as the above-described preferred embodiment. Specifically, this structure eliminates extra wire routing and reduces the parasitic inductance component of the wiring to achieve intended circuit characteristics.

The composite component-embedded circuit boards according to preferred embodiments of the present invention and the modified examples have been described above. The present invention, however, is not limited to the preferred embodiments and the modified examples. Within the scope of the gist of the present invention, preferred embodiments or each of the modified examples to which various other modifications thought by persons having skill in the art are applied, and a structure that combines components of different preferred embodiments or modified examples of the different preferred embodiments may also be included in the scope of one or more aspects of preferred embodiments of the present invention.

Besides being embodied as the above-described composite component-embedded circuit boards, the present invention may be embodied as, for example, a composite component embedded in a circuit board. Specifically, a composite component includes a multilayer element including a plurality of first base layers that are vertically laminated; a composite circuit that is a chip circuit disposed on the multilayer element, the composite circuit including a first circuit element and a second circuit element that are passive elements including pattern conductors embedded in the multilayer element; a first terminal electrode that is a flat electrode disposed on an upper surface of the multilayer element, the first terminal electrode being connected to a portion of the composite circuit; and a second terminal electrode that is a flat electrode disposed on a lower surface of the multilayer element, the second terminal electrode being connected to another portion of the composite circuit.

The purpose of the above-described composite component is not limited to an embedded use. For example, the composite component may include a lower surface mounted on a printed circuit board and/or an upper surface connected to a flexible wiring board or flexible cable.

In preferred embodiments of the present invention, various values such as the thickness or the shape of the layers of each composite component, and the position or the size of each conductor are not particularly limited. In addition, physical properties, such as ingredients of ceramic materials defining each layer of the composite component, the compounding ratio of the ingredients, or the magnetic permeability, and the physical properties, such as ingredients of the material used for, for example, conductors in the composite components, the compounding ratio of the ingredients, or the electric conductivity are not particularly limited. These values are appropriately determined in consideration of various electrical characteristics, such as inductance values or DC superposition characteristics required for the composite components.

Similarly, various values, such as the thickness or the shape of the layers of the multilayer substrate, and the position or the size of each conductor are not particularly limited. In addition, physical properties, such as ingredients of resin materials defining each layer of the multilayer substrate, the compounding ratio of the ingredients, ingredients of the material used for, for example, conductors in the multilayer substrate, the compounding ratio of the ingredients, or the electric conductivity are not particularly limited. These values are appropriately determined in consideration of circuit characteristics, such as high-frequency characteristics required for a circuit (for example, a receiving circuit) including the composite component-embedded circuit board.

The number of base layers defining the multilayer element of the circuit board and the number of magnetic ceramic layers defining the multilayer element of each composite component are not limited to those described above.

Each composite component does not necessarily have to include a multilayer element (laminated ceramic element in the above description). Specifically, instead of a multilayer component, each composite component disposed on a semiconductor substrate, such as a silicon substrate may be, for example, an IC chip. Specifically, instead of a passive element, the first circuit element or the second circuit element may be a positive element, such as a diode or a transistor, for example.

The layout of the pattern conductors defining the first circuit element and the pattern conductors defining the second circuit element is not limited to the above-described layouts. For example, the pattern conductors defining the first circuit element may be one-sidedly located closer to the lower surface of each composite component, or the pattern conductors defining the second circuit element may be one-sidedly located closer to the upper surface of the composite component.

The first terminal electrodes 121 and the second terminal electrodes 122 do not have to overlap each other when the circuit board is viewed in a plan.

The composite component may include only one first terminal electrode 121. For example, the first terminal electrode 121 may define and function as an input terminal, and the second terminal electrode 122 may define and function as an output terminal.

The module component may define a transmission circuit. The first terminal electrode 121 connected to an RFIC may be an input terminal that receives signals from a signal processing circuit including the RFIC.

The circuit board may be a single-layer substrate, instead of a multilayer substrate including multiple second base layers (thermoplastic resin layers in the above description).

The second functional block may be, for example, an electrical component, instead of a conductor such as a ground pattern conductor or an antenna pattern conductor.

The composite circuit is not limited to an LC composite circuit. For example, both of the first and second circuit elements may be inductors. Examples of such a composite circuit include a balun and a coupler.

The main base material of the composite component is not limited to ceramics and may be a resin, for example. The main base material of the circuit board is not limited to a resin. The main base material of the composite component and the circuit board may be the same material, such as a resin, for example.

The composite component-embedded circuit board may include the first functional block and the second functional block included in the circuit board. The entirety or substantially the entirety of the above-described module component may be a composite component-embedded circuit board.

Each circuit board of the preferred embodiments and the modified examples may be a portion of a substrate larger than the circuit board. Other components, such as a large number of electrical components and pattern conductors other than those illustrated in the preferred embodiments and the modified examples may be mounted on or embedded in the substrate.

Preferred embodiments of the present invention are widely usable, as composite component-embedded circuit boards and composite components, for portable terminal devices of, for example, cellular phone handsets.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite component-embedded circuit board, comprising:
    a circuit board including a first functional block disposed closer to an upper surface of the circuit board, and a second functional block different from the first functional block and disposed closer to a lower surface of the circuit board; and
    a composite component embedded in the circuit board, the composite component being a chip of a composite circuit including a first circuit element and a second circuit element; wherein
    the composite component further includes:
        a first terminal electrode disposed on an upper surface of the composite component, the first terminal electrode being connected to the composite circuit and to the first functional block; and
        a second terminal electrode disposed on a lower surface of the composite component, the second terminal electrode being connected to the composite circuit and to the second functional block;

the first functional block includes a signal processing circuit; and the signal processing circuit is defined by a radio frequency integrated circuit (RFIC) and includes an electrical component mounted on the upper surface of the circuit board.

2. The composite component-embedded circuit board according to claim 1, wherein the first circuit element and the second circuit element are passive elements; and the composite component further includes:

a multilayer element including a plurality of first base layers that are vertically laminated together; and pattern conductors embedded in the multilayer element, the pattern conductors defining the first circuit element and the second circuit element.

3. The composite component-embedded circuit board according to claim 2, wherein the first circuit element and the second circuit element are serially connected between the first terminal electrode and the second terminal electrode, the pattern conductor defining the first circuit element is one-sidedly located closer to the upper surface of the composite component, and the pattern conductor defining the second circuit element is one-sidedly located closer to the lower surface of the composite component.

4. The composite component-embedded circuit board according to claim 1, wherein the first terminal electrode and the second terminal electrode are disposed to at least partially overlap each other when the circuit board is viewed in a plan view.

5. The composite component-embedded circuit board according to claim 1, wherein the composite component includes a plurality of the first terminal electrodes.

6. The composite component-embedded circuit board according to claim 1, wherein the first terminal electrode defines and functions as an input terminal that receives signals from the signal processing circuit, or an output terminal that outputs signals to the signal processing circuit;

the second functional block includes a ground;

the second terminal electrode defines and functions as a ground terminal connected to the ground;

the upper surface of the composite component does not include a ground terminal disposed thereon; and the lower surface of the composite component does not include the input terminal, which receives signals from the signal processing circuit, or the output terminal, which outputs signals to the signal processing circuit, disposed thereon.

7. The composite component-embedded circuit board according to claim 6, wherein the second terminal electrode is disposed on an entirety or substantially an entirety of the lower surface of the composite component.

8. The composite component-embedded circuit board according to claim 6, wherein the circuit board is a multilayer substrate including a plurality of second base layers that are vertically laminated together; and the second functional block is a ground pattern conductor disposed in the circuit board.

9. The composite component-embedded circuit board according to claim 1, wherein the composite circuit is an LC composite circuit in which one of the first circuit element and the second circuit element is a capacitor and another one of the first circuit element and the second circuit element is an inductor.

10. The composite component-embedded circuit board according to claim 9, wherein one opposing electrode of a pair of opposing electrodes defining the capacitor includes the first terminal electrode or the second terminal electrode.

11. The composite component-embedded circuit board according to claim 1, wherein the composite component includes ceramics as a main base material.

12. The composite component-embedded circuit board according to claim 1, wherein the circuit board includes a resin as a main base material.

13. The composite component-embedded circuit board according to claim 1, wherein the first functional block is disposed closer to the upper surface than is the composite component, and the second functional block is disposed closer to the lower surface than is the composite component.

14. A composite component comprising:

a multilayer element including a plurality of first base layers that are vertically laminated together;

a composite circuit defined by a chip on the multilayer element, the composite circuit including a first circuit element and a second circuit element that are passive elements including pattern conductors embedded in the multilayer element;

a first terminal electrode disposed on only an upper surface of the multilayer element, the first terminal electrode being connected to a portion of the composite circuit; and a second terminal electrode disposed on only a lower surface of the multilayer element, the second terminal electrode being connected to another portion of the composite circuit; wherein the second circuit element of the composite circuit includes a capacitor conductor, and an entirety or substantially an entirety of the capacitor conductor overlaps the second terminal electrode.

15. The composite component according to claim 14, wherein the first terminal electrode defines and functions as an input terminal that receives signals from a signal processing circuit, or an output terminal that outputs signals to the signal processing circuit;

the second terminal electrode defines and functions as a ground terminal connected to a ground;

the multilayer element includes the upper surface not connected to the ground; and the multilayer element includes the lower surface not connected to the signal processing circuit.

16. The composite component according to claim 14, wherein the first terminal electrode and the second terminal electrode are disposed to at least partially overlap each other when the circuit board is viewed in a plan view.

17. The composite component according to claim 14, further comprising a plurality of the first terminal electrodes.

18. The composite component according to claim 14, wherein the second terminal electrode is disposed on an entirety or substantially an entirety of the lower surface of the multilayer element.

19. The composite component according to claim 14, wherein the composite circuit is an LC composite circuit in which one of the first circuit element and the second circuit element is a capacitor and another one of the first circuit element and the second circuit element is an inductor.

* * * * *